(12) United States Patent
Sunaoshi et al.

(10) Patent No.: US 7,485,879 B2
(45) Date of Patent: Feb. 3, 2009

(54) ELECTRON BEAM WRITING APPARATUS AND WRITING METHOD

(75) Inventors: Hitoshi Sunaoshi, Kanagawa (JP); Shuichi Tamamushi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 318 days.

(21) Appl. No.: 11/478,744

(22) Filed: Jul. 3, 2006

(65) Prior Publication Data

US 2007/0023703 A1 Feb. 1, 2007

(30) Foreign Application Priority Data

Jul. 4, 2005 (JP) ............................. 2005-194771
Apr. 13, 2006 (JP) ............................. 2006-111315

(51) Int. Cl.
*G21K 5/00* (2006.01)

(52) U.S. Cl. .............................. 250/492.22; 250/492.1; 250/492.2; 250/492.21; 250/492.23; 250/492.3; 250/396 R; 250/398; 430/30; 430/296

(58) Field of Classification Search .............. 250/492.1, 250/492.2, 492.21, 492.22, 492.23, 492.3, 250/396 R, 398; 430/30, 296
See application file for complete search history.

(56) References Cited

U.S. PATENT DOCUMENTS 4,586,141 A * 4/1986 Yasuda et al. ................ 430/296
5,932,884 A * 8/1999 Aizaki .................... 250/492.23
2002/0028398 A1 3/2002 Ogino
2004/0000649 A1 1/2004 Yasuda et al.

FOREIGN PATENT DOCUMENTS

| JP | 55-46553 | 4/1980 |
| JP | 56-32726 | 4/1981 |
| JP | 59-208720 | 11/1984 |
| JP | 3-173119 | 7/1991 |
| JP | 04-171714 | 6/1992 |
| JP | 10-302685 | 11/1998 |
| JP | 2000-058424 | 2/2000 |

* cited by examiner

*Primary Examiner*—Jack I. Berman
*Assistant Examiner*—Michael Maskell
(74) *Attorney, Agent, or Firm*—Oblon, Spivak, McClelland, Maier & Neustadt, P.C.

(57) ABSTRACT

A writing apparatus including a selector unit responsive to receipt of input data of a pattern to be written by shots of irradiation of an electron beam, configured to select a current density of the electron beam being shot and a maximal shot size thereof based on the input data of the pattern to be written; and a writing unit configured to create an electron beam with the current density selected by said selector unit, shape the created electron beam into a shot size less than or equal to said maximal shot size in units of the shots, and shoot the shaped electron beam onto a workpiece to thereby write said pattern.

26 Claims, 22 Drawing Sheets

Writing Time $\quad T = T_c \cdot N_{shot}$ ———————— (1)

Shot Cycle $\quad T_c = T_{set} + T_{shot}$ ———— (2)

Shot Time $\quad T_{shot} = \dfrac{D_{ose}}{J}$ ———— (3)

FIG. 3

Writing Time $\quad T = \left( T_{set} + \dfrac{D_{ose}}{J} \right) N_{shot}$ ———— (4)

( Note: $N_{shot}$ varies depending on Max. Shot Size )

FIG. 4

$(I_1, \ J_1, \ L_1,)$ $(I_2, \ J_2, \ L_2,)$
$= (\frac{1}{4}I_1, \ J_1, \ \frac{1}{2}L_1,)$ $(I_3, \ J_3, \ L_3,)$
$= (\ I_1, \ 4J_1, \ \frac{1}{2}L_1,)$ Shaped Beam

ELECTRON BEAM WRITING APPARATUS AND WRITING METHOD

CROSS-REFERENCE TO RELATED APPLICATION

This application claims priority to Japanese Patent Application No. JP 2005-194771, filed on Jul. 4, 2005 and also to JP 2006-111315 filed Apr. 13, 2006, the disclosures of which are incorporated herein by reference.

FIELD OF THE INVENTION

The present invention relates generally to writing apparatus and methodology and, more particularly, to exposure techniques for use in variable-shaped electron beam lithography systems.

RELATED ART OF THE INVENTION

In recent years, highly integrated semiconductor devices decrease in on-chip patterns with an increase in integration density of large-scale integrated (LSI) circuits. To form a desired circuit pattern on such semiconductor devices, a microlithographic exposure apparatus is used. A prior known approach to doing this is to employ a process having the steps of placing a chosen one of masks (e.g., reticles or photomasks) with many kinds of original or "master" image patterns being formed thereon, mounting on a stage structure a workpiece such as a semiconductor wafer having its exposure surface area, performing highly accurate position alignment of the master pattern relative to the wafer exposure area, and driving a light source to emit a beam of laser light, which falls onto the wafer so that the mask circuit pattern is transferred onto the exposure area of the target wafer. An example of such apparatus is a reduced image projecting exposure tool. The master pattern is imaged and formed on a fine-finished glass plate by resist processes and others. Usually a glass substrate is prepared which has its one-side surface with a thin film of chromium (Cr) being vapor-deposited. Then, a film of resist material is uniformly deposited on the substrate. An energy particle beam, such as electron beam or laser beam, is used to perform the sensitization of the resist material at selected surface portions thereof. After completion of known development, the Cr film is selectively etched to thereby write or "form" or "draw" the pattern.

Microlithography processes that take on advances in miniaturization of semiconductor devices are unique in creation of patterns and thus are very important among semiconductor device fabrication processes. While optical lithography techniques have traditionally been employed in the manufacture of semiconductor devices as stated above, it is an urgent need to develop an advanced high-resolution exposure technique in view of the fact that leading-edge devices with extra-high integration densities, such as ultralarge-scale integration (ULSI) chips, are coming closer to the limit of resolution.

Electron ray (electron beam) exposure techniques offer in nature superior resolution properties and, for this reason, are used for development and mass-production of leading-edge devices, such as dynamic random access memory (DRAM) chips and some of application-specific integrated circuit (ASIC) devices. The EB exposure is also used in combination with standard optical lithography processes to form master patterns for fabrication of such leading-edge ULSI devices.

See FIG. 27, which shows some major components of a prior known variable-shaped electron beam exposure apparatus for explanation of an operation thereof. As shown herein, this EB exposure tool includes a couple of spaced-apart aperture plates 410 and 420. The upper aperture 410 has a rectangular opening 411, which shapes an electron beam leaving a charge particle source 430 and then falling onto aperture 410. The lower aperture 420 has a variable shaping opening 421 for shaping the electron beam 330 that has passed through the upper aperture opening 411 into a desired rectangular cross-section. After penetration of the aperture opening 411, the electron beam 330 is deflected by a deflector to pass through part of the lower aperture opening 421, resulting in irradiation onto a target workpiece which 340 is placed on a stage that is movable in a one direction, e.g., X-axis direction. In short, only a specific pattern with a rectangular cross-section capable of passing through both aperture openings 411 and 420 is irradiated or "shot" onto the workpiece surface so that the intended pattern is drawn in the aimed exposure region of workpiece 340 on the stage moving along the X direction. This approach to forming a desired shape by letting the beam penetrate both the aperture holes 411 and 421 is called the "variable shaping," as disclosed, for example, in JP-A-2000-58424.

Another EB exposure apparatus is found in JP-A-4-171714, which involves teachings as to the shot size and current density.

The above-stated EB exposure apparatus is designed so that the current density and maximal shot size are subjected to value setting along the scale of the nodes of interest in semiconductor road map at the stage of manufacture thereof in such a way as to preclude decreases in beam resolution otherwise occurring due to "space charge" effects when shooing the beam with the maximum shot size. Thereafter, in the apparatus, such initially determined current density value is used to form the electron beam, which is shaped to have its shot size that is less than or equal to the first defined maximum shot size for execution of the pattern drawing on wafers or masks or else.

Unfortunately, as the to-be-drawn pattern becomes finer and more complicated, the shot size in each shot event gets smaller, resulting in an increase in total number of beam shots. This poses a problem as to unwanted increase in time as taken to draw an entirety of the pattern. This leads to degradation of throughput. To shorten the drawing time of each shot (i.e., shot time), it is effective to increase the current density. However, a mere increase in current density results in an increase in degradation of beam resolution due to space-charge effects—i.e., defocusing of electron beam pattern images. Thus, the scheme for simply increasing the current density is hardly employable in practical applications.

BRIEF SUMMARY OF THE INVENTION

It is an object of a currently preferred form of the present invention to avoid the problems stated above to thereby provide a scheme for achieving maximally increased throughputs while at the same time suppressing degradation of beam resolution.

In accordance with one aspect of this invention, there is provided a writing apparatus which includes a selector unit responsive to receipt of input data of a pattern to be written by shots of irradiation of an electron beam, configured to select a current density of the electron beam being shot and a maximal shot size thereof based on the input data of the pattern to be written, and a writing unit configured to create an electron beam with the current density selected by said selector unit, shape the created electron beam into a shot size less than or equal to said maximal shot size in units of the shots, and shoot the shaped electron beam onto a workpiece to thereby write said pattern.

In accordance with another aspect of this invention, a writing method includes, analyzing a value of a writing time pursuant to a pattern data while using as variables a current density and a maximal shot size being in a relationship that a beam current value is less than or equal to a preset value, selecting, based on a result of said analyzing, a current density and a maximal shot size so as to be in a vicinity of a point of inflexion at which the writing time value changes in concavity, and shooting an electron beam onto a workpiece with the selected current density and a shot size less than or equal to said maximal shot size to thereby write thereon a pattern pursuant to said pattern data.

In accordance with a further aspect of this invention, a writing apparatus includes a selector unit responsive to receipt of input data of a pattern to be written through more than two electron beam shots, configured to select a current density of an electron beam being shot and a maximal shot area thereof based on the inputted data of the pattern to be written, and a writing unit configured to form the electron beam with the current density as selected by said selector unit, shape the formed electron beam to have a shot area less than or equal to said maximal shot area, and shoot the shaped electron beam onto a workpiece to thereby write said pattern.

In accordance with another further aspect of this invention, there is provided an apparatus for writing a prespecified pattern on a workpiece through more than two shots of an electron beam, includes means for variably shaping shot size of a shot, and means for varying a current density in accordance with each shot size so that a current value of a beam being shot onto the workpiece is less than or equal to a value as preset in each shot.

BRIEF DESCRIPTION OF THE DRAWINGS

FIG. 3 shows equations for calculation of an "ideal" pattern drawing time.

FIG. 4 shows an equation for writing time calculation.

DETAILED DESCRIPTION OF THE INVENTION

Embodiment 1

Figure 1:
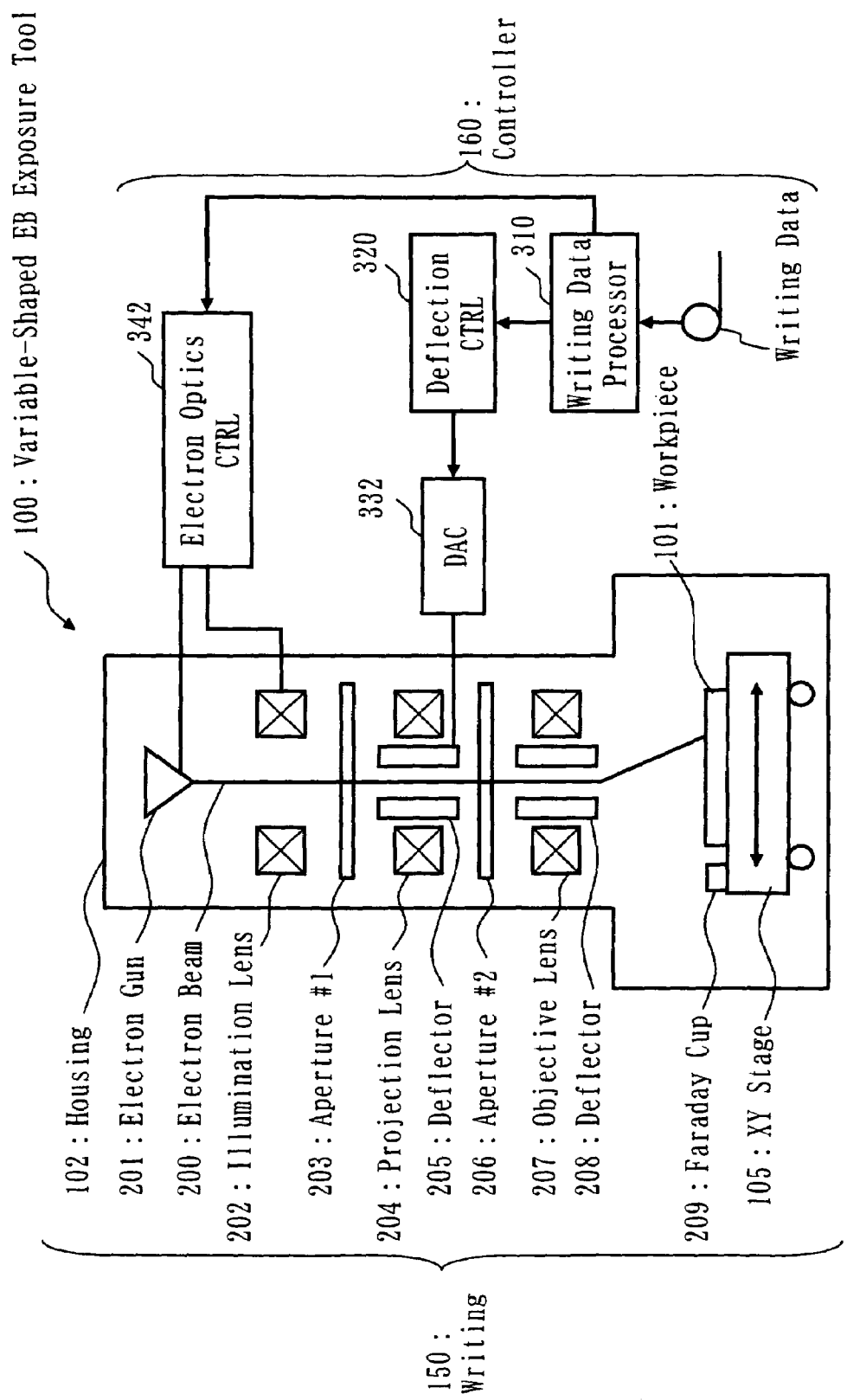
FIG. 1 is a diagram schematically showing, in block diagram form, a system configuration of main part of an electron beam lithography apparatus embodying the invention.

Referring to FIG. 1, a variable-shaped electron beam (EB) microlithographic pattern writing/exposure apparatus 100 in accordance with a first embodiment of this invention is shown in schematic block diagram form. This EB lithography apparatus is generally made up of a scanning beam pattern writing unit 150 and a system control unit 160 as operatively associated therewith. The pattern writing or "imaging" unit 150 includes a tower-like housing 102 called the electron optical colum, a stage structure 105 that is movable in X and Y directions, an electron gun assembly 201, an illumination lens 202, an upper beam-shaping aperture plate 203 as will be referred to as "first aperture" hereinafter, a projection lens 204, a deflector 205, a lower beam-shaping aperture plate (second aperture) 206, an objective lens 207, a deflector 208, and a Faraday cup 209. The system controller 160 includes a draw data processing circuit 310 that functions as a data selector, a beam deflection control circuit 320, a digital-to-analog converter (DAC) 332, and an electron optics control circuit 342. Obviously the EB lithography tool 100 includes other known components, which are eliminated from the illustration for brevity purposes only.

The electron gun 201 is driven to emit an electron beam 200, which is guided by the illumination lens 202 to illuminate an entirety of the first aperture 203 having a square opening or hole. The electron beam is shaped by aperture 203 to have a square-shaped cross-section. This shaped beam 200 that passed through aperture 203—namely, first aperture image beam—is then projected by the projection lens 204 onto the second aperture 206. A position of the first aperture image on second aperture 206 is controlled by the deflector 205 so that its beam shape and size are made variable. The resultant electron beam 200 of a second aperture image which passed through second aperture 206 is focus-adjusted by the objective lens 207 and deflected by deflector 208 to fall onto a workpiece 101 being presently placed on the movable X-Y stage 105 at a desired position thereon. The electron beam 200 irradiated in such case is shaped to have a rectangular illumination area on workpiece 101 along the shape of a pattern, with a shot size being less than or equal to a prespecified maximum shot size.

Figure 2:
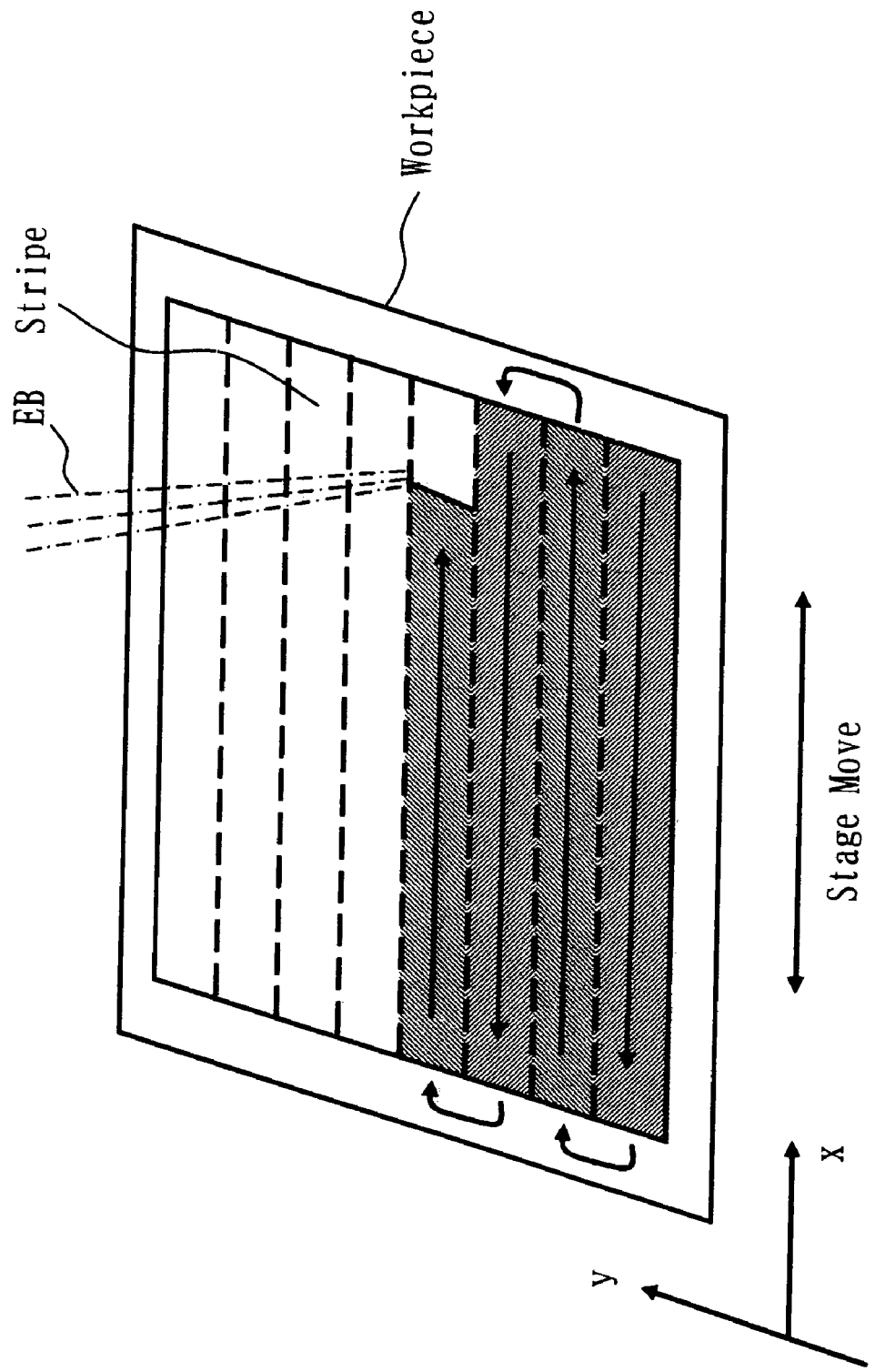
FIG. 2 is a perspective view of a workpiece which is mounted on a movable stage of the apparatus shown in FIG. 1.

As shown in FIG. 2, the workpiece 101 has an exposure surface on which a pattern is to be written. This surface is virtually subdivided into a plurality of strip-like beam-deflectable portions. When writing the pattern on workpiece 101, the XY stage 105 is driven by a known actuator (not shown) to move or slide continuously in the X direction so that the incoming electron beam 200 scans one stripe area along the length thereof. During the movement of XY stage 105 in the X direction, let the shot position of electron beam on workpiece 101 follow or "trace" the stage motion in a way synchronous therewith. This makes it possible to shorten a time taken to complete the pattern writing required. After having written a pattern in one stripe of workpiece 101, the XY stage 105 is driven by the actuator (not shown) to move in step along the Y direction and then move backward in X direction so that the incoming beam scans the next stripe for execution of pattern writing thereto. In other words, XY stage 105 alternately performs continuous forward/backward movements in X direction and movements in steps along Y direction, thereby permitting the beam 200 to scan respective exposure strips of workpiece 101 on XY stage 105 in a serpentine fashion. With this serpentine stage motion control, it is possible to minimize any possible idle time during movement of XY stage 200, thereby to increase or maximize the efficiency of stage motion-control operation.

As shown in FIG. 3, a total time T as required for completion of the writing of a pattern is represented by Equation (1) which follows:

$$T = Tc \cdot N\text{shot}, \tag{1}$$

where, Tc is the shot cycle, and Nshot is the total shot number. The shot cycle Tc is given as:

$$Tc = T\text{set} + T\text{shot}, \tag{2}$$

where, Tset is a settling time. The shot time Tshot is given by:

$$T\text{shot} = \text{DOSE}/J, \tag{3}$$

where, "DOSE" is the dose of an electron beam hitting the workpiece 101, and J is the current density. The moving speed of XY stage 105 in X direction is calculated based on the writing time T, although in practical applications the writing time is somewhat increased with an addition of the XY stage's stepping times between stripes and also of other extra time components, such as an overhead time(s).

As shown in FIG. 4, the pattern writing time T is finally represented as:

$$T = (T\text{set} + \text{DOSE}/J)N\text{shot} \tag{4}$$

Note here that the settling time Tset is "automatically" determined depending on the specifications of apparatus used. The dose amount DOSE is determined by the performance of a resist material to be exposed. Thus, the writing time T may be lessened in value by finding an optimal value while letting the current density J and the total shot number Nshot be parameters or "variables."

The variable-shaped EB exposure apparatus 100 shown in FIG. 1 employs an electrolytic deflector(s) as the deflector 205 and/or deflector 208 for position control of the electron beam 200. Use of such electrolytic deflector(s) makes it possible to control the beam deflection amount by varying a voltage to be applied to the deflector 205 or 208. When varying this voltage, a certain length of time is needed to stabilize it to a preset potential level. This time is called the settling time Tset stated previously. In the variable-shaping EB exposure tool 100, the settling time Tset becomes different in value in accordance with the magnitude of the voltage to be varied, which corresponds to the change quantity of a beam position. For instance, several tens of us is required. The optimal settling time is verified at system setup events, so it is recommendable to set it as a parameter in the writing data processor circuit 310 shown in FIG. 1.

Figure 5A:
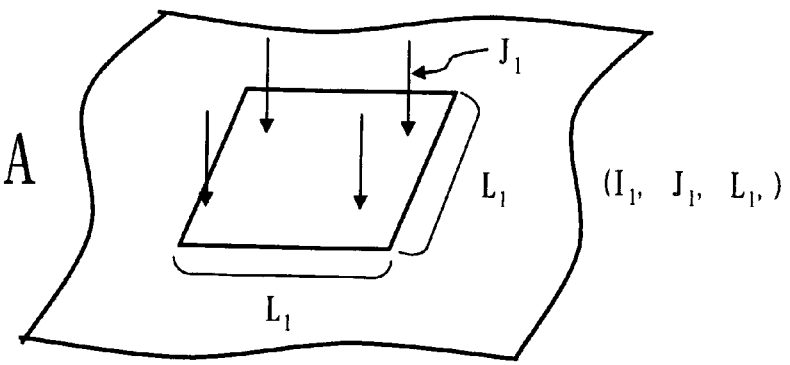
FIGS. 5A to 5C are diagrams each showing a relationship of the current density versus shot size.
Figure 5B:
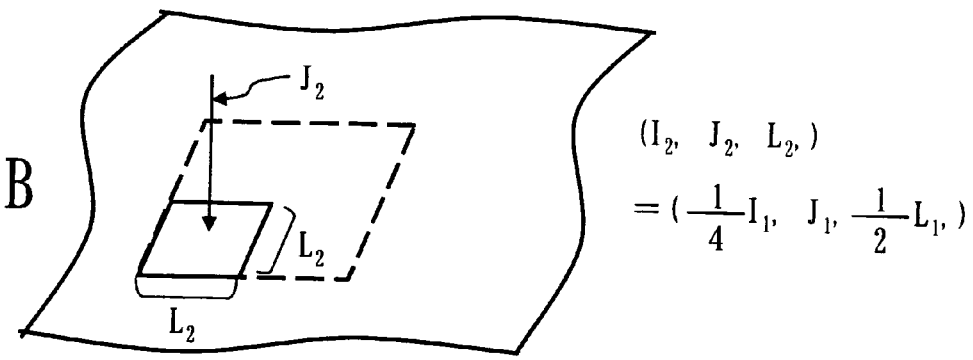
Figure 5C:
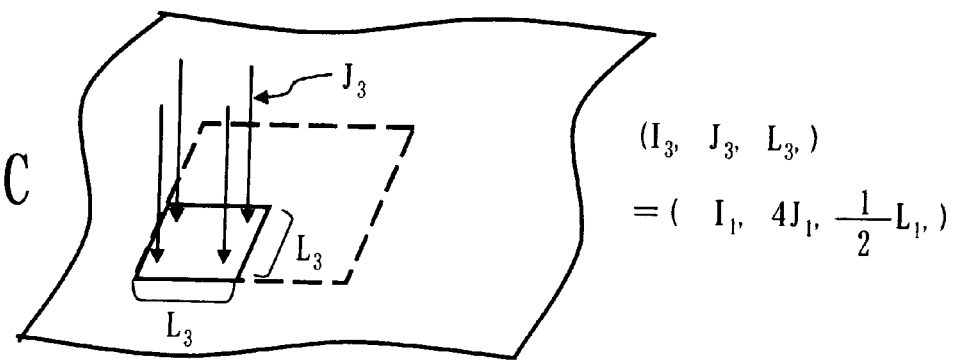

The current density has certain relation to the beam shot size as will be described with reference to FIGS. 5A to 5C below. The current density J is given as a beam current value I per unit area. Suppose that an electron beam 200 with a square cross-section is irradiated onto the workpiece 101 while letting the maximum shot size be L1. If this is the case, as shown in FIG. 5A, a maximal shot area S is indicated by a square value of the maximum shot size L1. Note here that the beam defocusing or degradation of beam resolution occurrable due to space charge effects as described in the introductory part of the description is dependent on the beam current value I. Also note that in each shot the shot area is maximized in the event that the beam is shaped into a square under the setting of the maximum shot size L1. Taking these facts into consideration, it is preferable to determine the beam current value I in such a way as to prevent unwanted increase of such beam fogging. An example is that an acceptable beam resolution was obtained by setting the maximum shot size L1 to 2.5 μm and letting the current density J1 range from 10 to 20 A/cm². This encourages us to believe that setting the beam current value I1 to 62.5 to 125 nanoamperes (nA) or less makes it possible to obtain the allowable beam resolution.

As previously stated, the shot size in each shot event decreases as a writing pattern decreases in minimum feature size and increases in complexity. While the apparatus has its performances with an ability to shape the electron beam 200 up to the maximum shot size of the value L1, the shot size in practical applications is limited to L2 that is one-half (½) of L1 in maximum as shown in FIG. 5B. In the example of FIG. 5B, L2 is half of L1, so the maximum shot area is actually defined by a square value of L2, that is, it becomes one-forth (¼) in area. Thus, the current value I2 of a beam passing through it is ¼ of I1. As the writing time T is shortened by increasing the current density J as indicated in Equation (4), it is effective to enlarge the current density J. No appreciable degradation of beam resolution is found even when increasing the current density J so that a beam current value I3 becomes equal to I1 (I3=I1), as shown in FIG. 5C. More specifically, in the example of FIG. 5C, it is possible to set J3=4J1.

Figure 6:
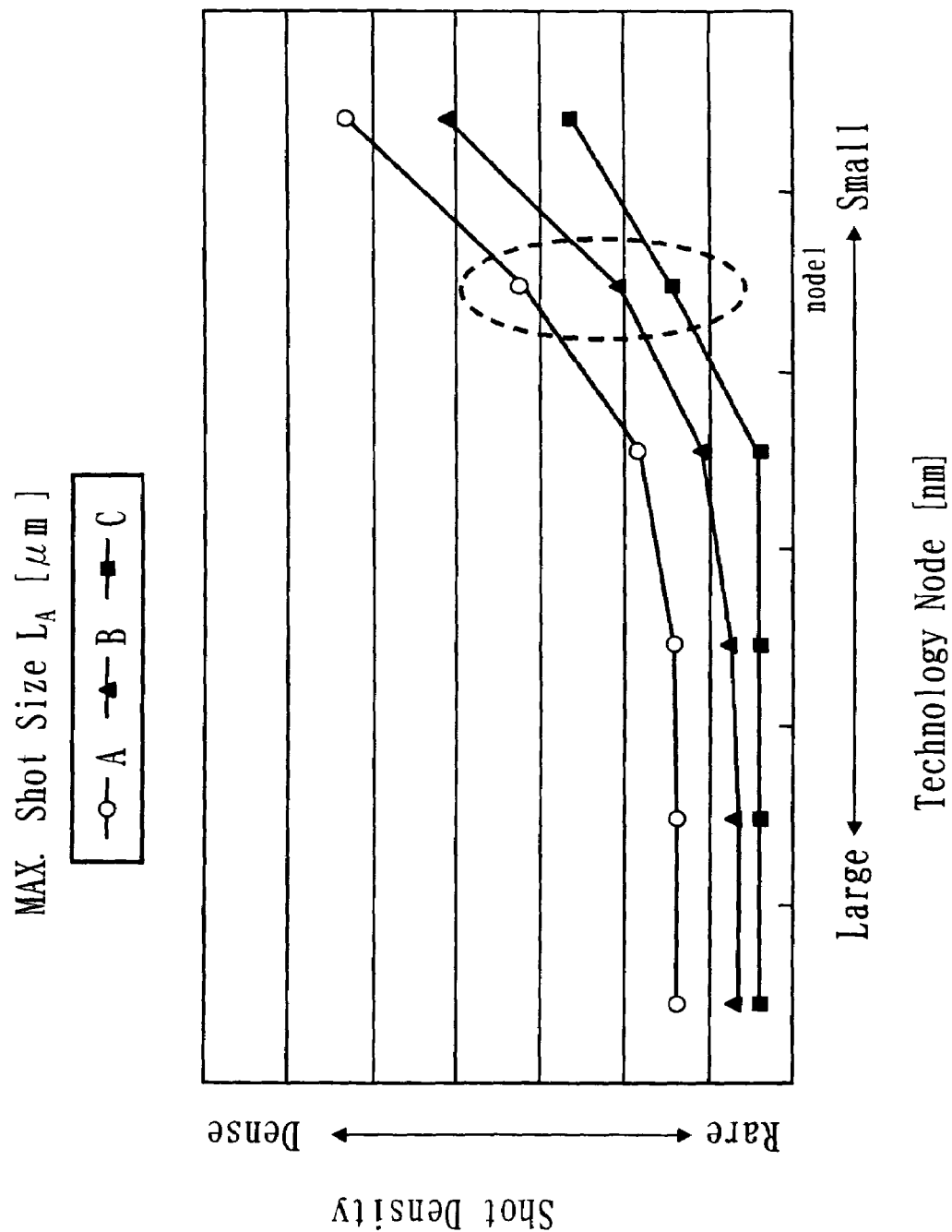
FIG. 6 is a diagram graphically showing an exemplary relationship between the shot density and technology node.

Exemplary plots of the beam shot density versus technology node for sample patterns A to C are graphically shown in FIG. 6. As shown herein, the beam shot density was measured for the patterns A-C while letting the maximum shot size L1 be set at L1. The measurement result reveals that the shot density rapidly increases at a certain point "node1" as the pattern to be written becomes finer and complicated. This shot density increase indicates that the total shot number Nshot rises up in value.

Figure 7:
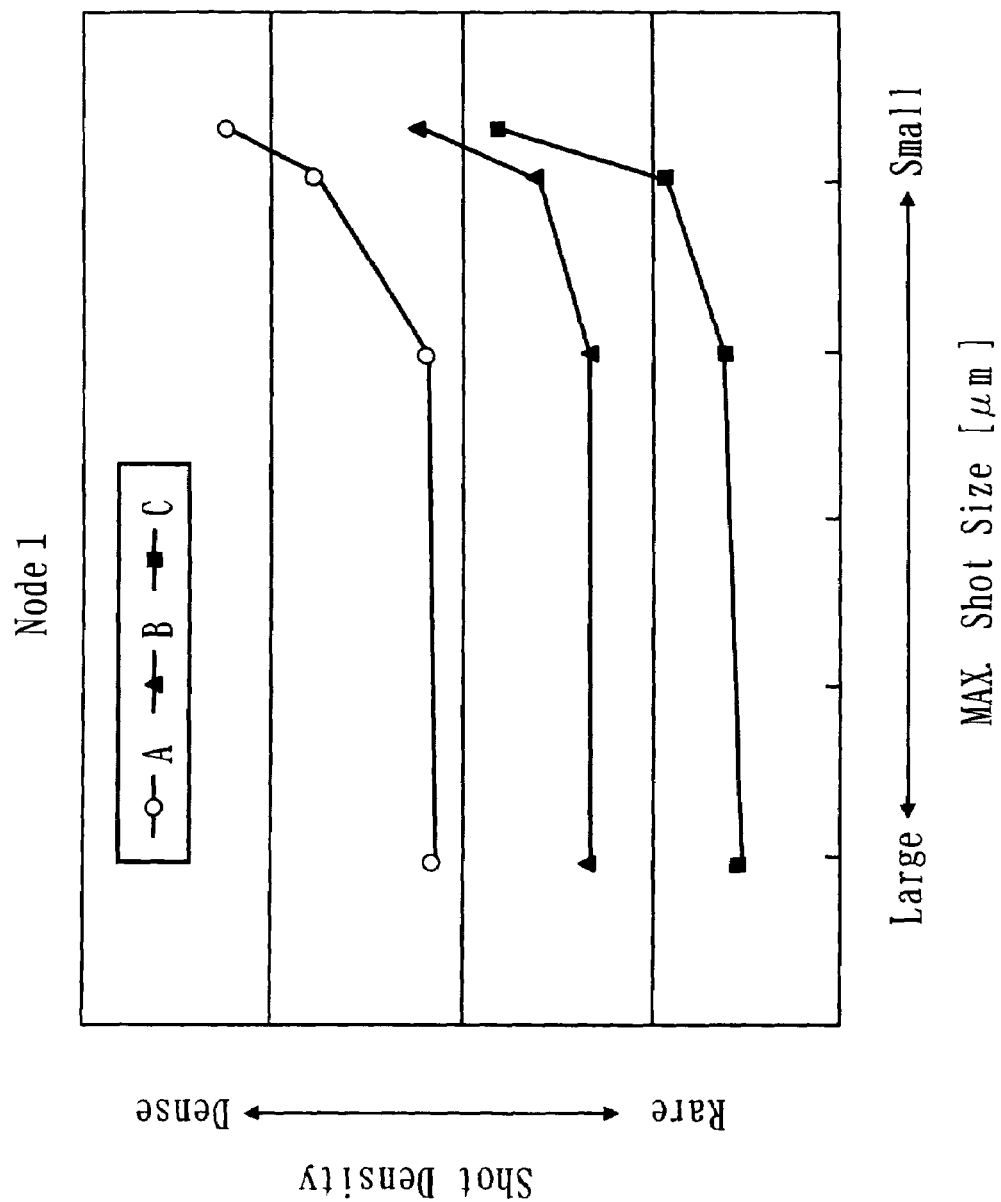
FIG. 7 is a graph showing an exemplary relationship between the shot density and maximum shot size.

See FIG. 7, which shows plots of shot density versus maximum shot size for the sample patterns A to C. As apparent from viewing this graph, when lessening the maximum shot size from the value used in FIG. 6 for the patterns A-C, the shot density exhibits no appreciable value changes within a certain range. In other words, in this situation, the total shot number Nshot does not increase. Hence, by simply decreasing the maximum shot size and increasing the current density J by a degree equivalent to such decrease in maximum shot size, it is possible to shorten the writing time T without having to deteriorate the beam resolution required.

However, as shown in FIG. 7, further lessening the maximum shot size results in a rapid increase in shot density, i.e., an appreciable increase in total shot number Nshot. Obviously, increasing the total shot number Nshot requires a likewise increase in settling time Tset. In this case, even when enlarging the current density J by the degree corresponding to the decrease in maximum shot size, the total shot number Nshot increases undesirably, so it is no longer possible to simply shorten the writing time T as shown in Equation (4).

Figure 8:
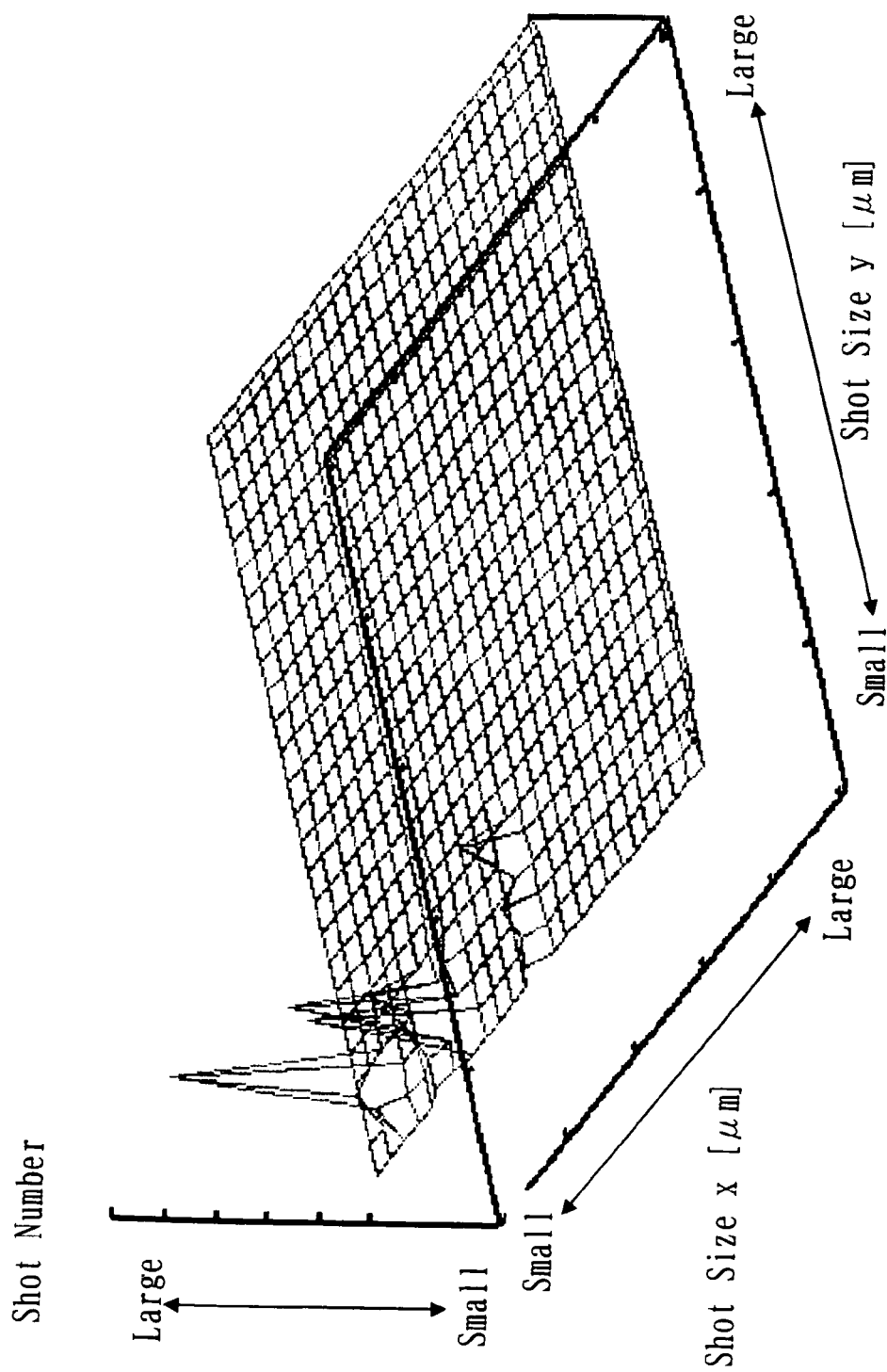
FIGS. 8 and 9 are diagrams each showing an example of shot-size distribution in a pattern.

See next FIG. 8 which is a three-dimensional (3D) graph showing an exemplary shot-size distribution in a given pattern. In this graph, the longitudinal size of an actually employed shot size is plotted along x axis in case the maximum shot size has its predefined longitudinal and lateral size dimensions. Its y axis indicates the lateral size of the actual shot size, whereas z axis shows the shot number. Assume that for sample pattern A, the electron beam is shaped to have a rectangle whose actual shot size is set so that a long-side length is long the x-axis and a shot-side length is y as shown in FIG. 7. It can be seen that the shot size dimensions are distributed with the x and y values being less than or equal to predetermined values respectively.

Figure 9:
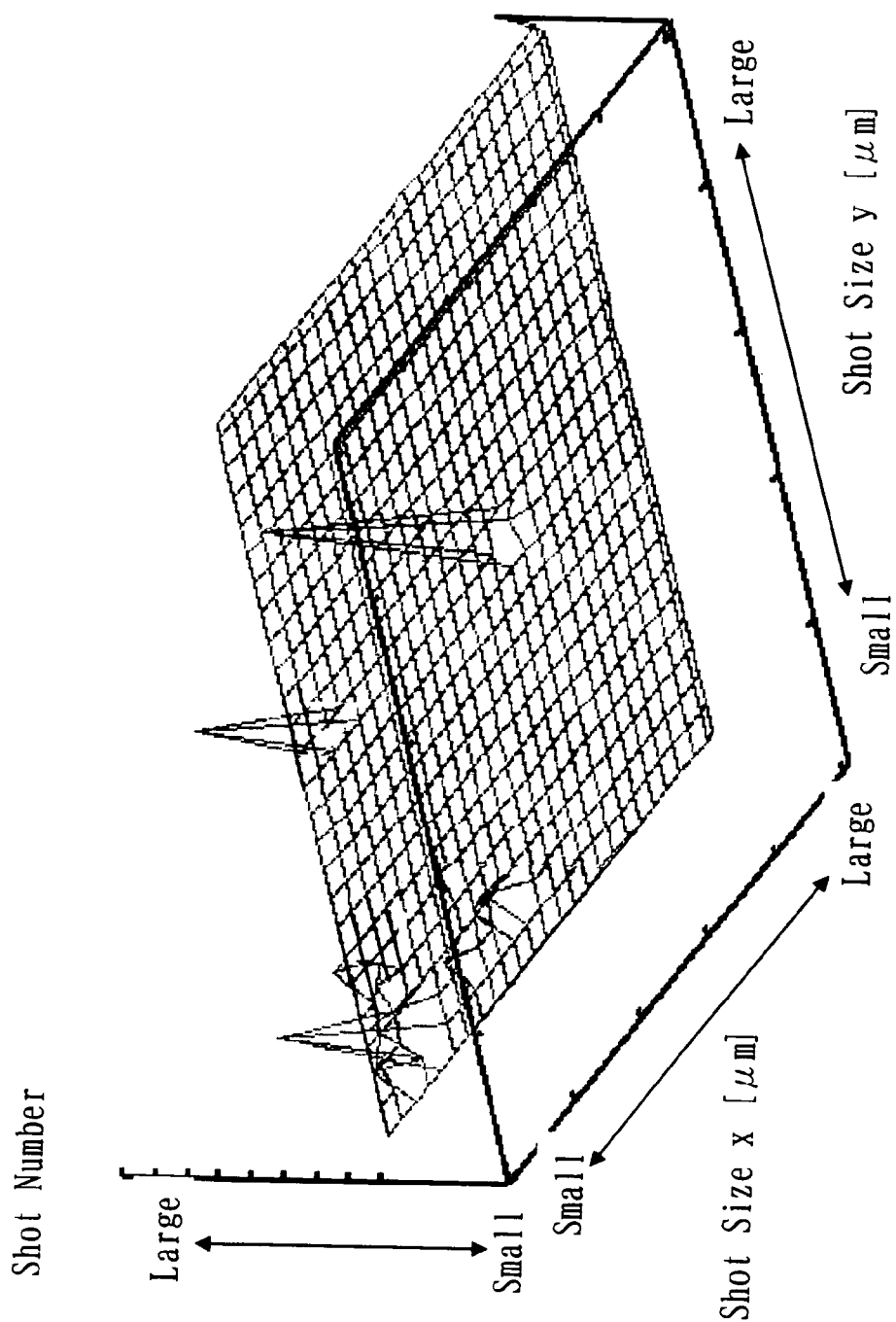

Another sample pattern B's shot size distribution is shown in FIG. 9. In a similar way to the graph of FIG. 8, the longitudinal and lateral sizes of an actual shot size and shot number are plotted along the x, y and z axes respectively when the longitudinal and lateral length values of maximum shot size are each set to a predefined value. As apparent from FIG. 9, the long-side length (x) and short-side length (y) of the pattern B with a rectangular shot size are distributed so that these fall within certain ranges having different values from those of FIG. 8, respectively.

Figure 10:
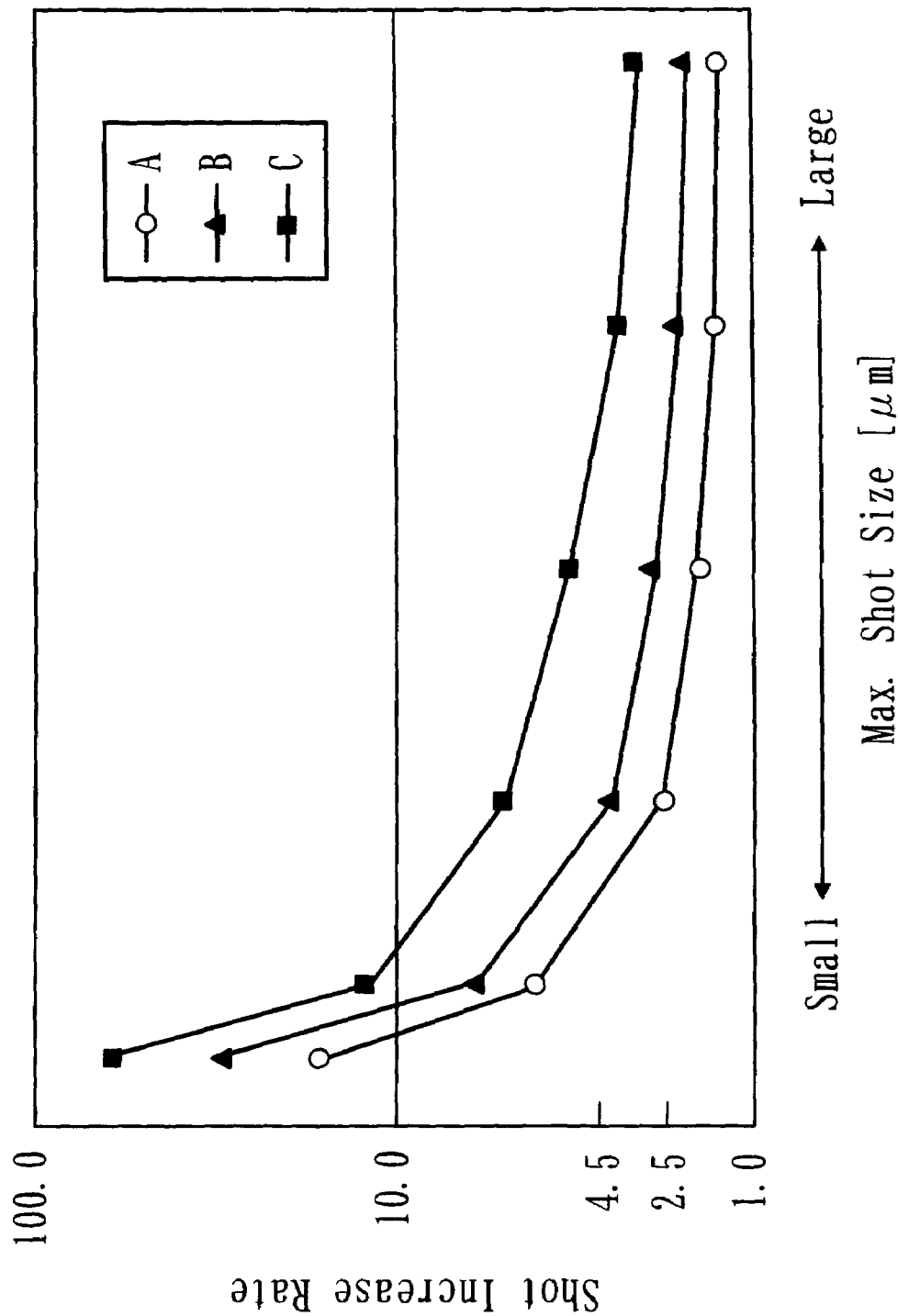
FIG. 10 is a graph showing exemplary plots of the rate of increase in total shot number versus the maximum shot size.

Exemplary plots of maximum shot size versus total shot number for sample patterns A-C are graphically shown in FIG. 10. For the patterns A-C, the maximum shot size of each is plotted along the longitudinal axis, whereas an increase ratio of the total shot number is along the lateral axis. When looking at the maximum shot size at a certain point, the pattern A is such that the total shot number is approximately 2.5 in increase rate. For the pattern B, its total shot number is about 4.5.

Thus, for some patterns, even when attempts are made to minimize the maximum shot size L and increase the current density J by a degree equivalent to such shot-size minimization, this do not always result in cut-down of the writing time T. This can be said because the total shot number Nshot increases accordingly. In other words, it has been found by the inventors as named herein that a curve-change or "inflexion" point at which the writing time T turns into increase from decrease must exist in the process of lessening the maximum shot size L (alternatively, enlarging the current density J).

Figure 11:
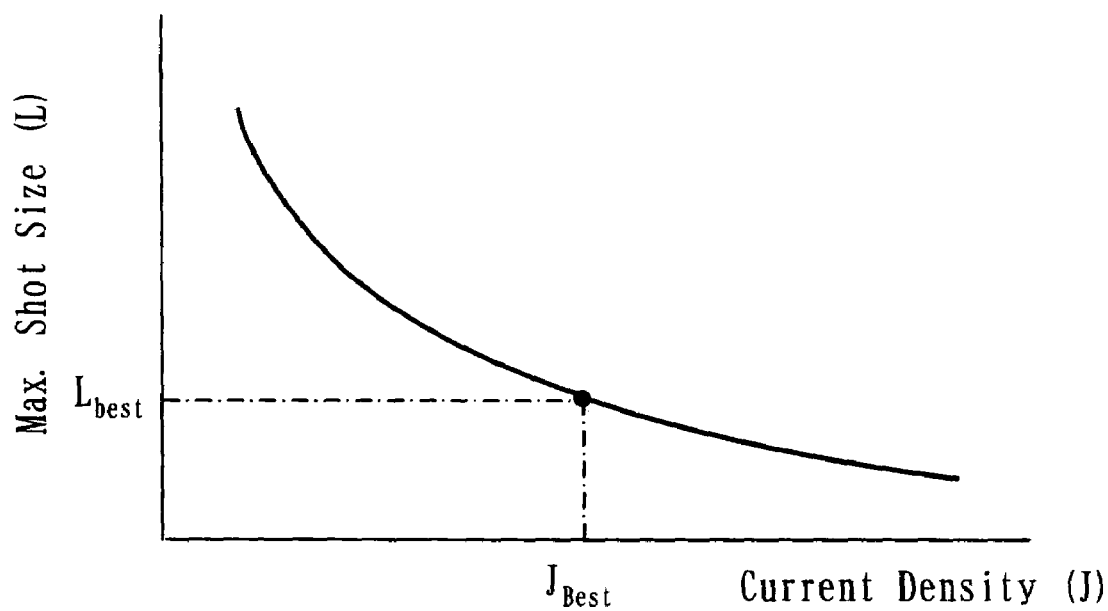
FIG. 11 is a graph showing a plot of maximal shot size versus current density.

A curve indicating variation of the maximum shot size L versus the current density J is shown in FIG. 11. As shown herein, when letting the maximum shot size L and current density J have a specific relation therebetween so that the beam current value stays at its preset value, the maximum shot size L decreases with an increase in current density J.

Figure 12:
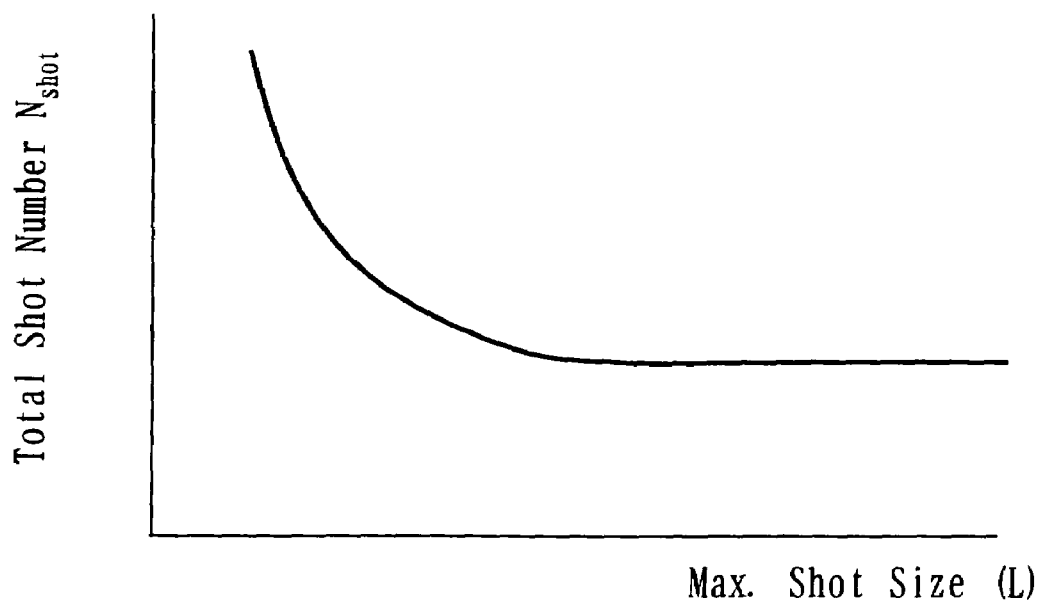
FIG. 12 is a graph showing a curve of total shot number vs. maximum shot size.

A plot of the total shot number Nshot versus maximum shot size L is shown in FIG. 12. As shown in this graph, the total shot number Nshot decreases with a decrease in maximum shot size L, and thereafter does not increase and is almost "saturated" irrespective of any further changes in maximum shot size L.

Figure 13:
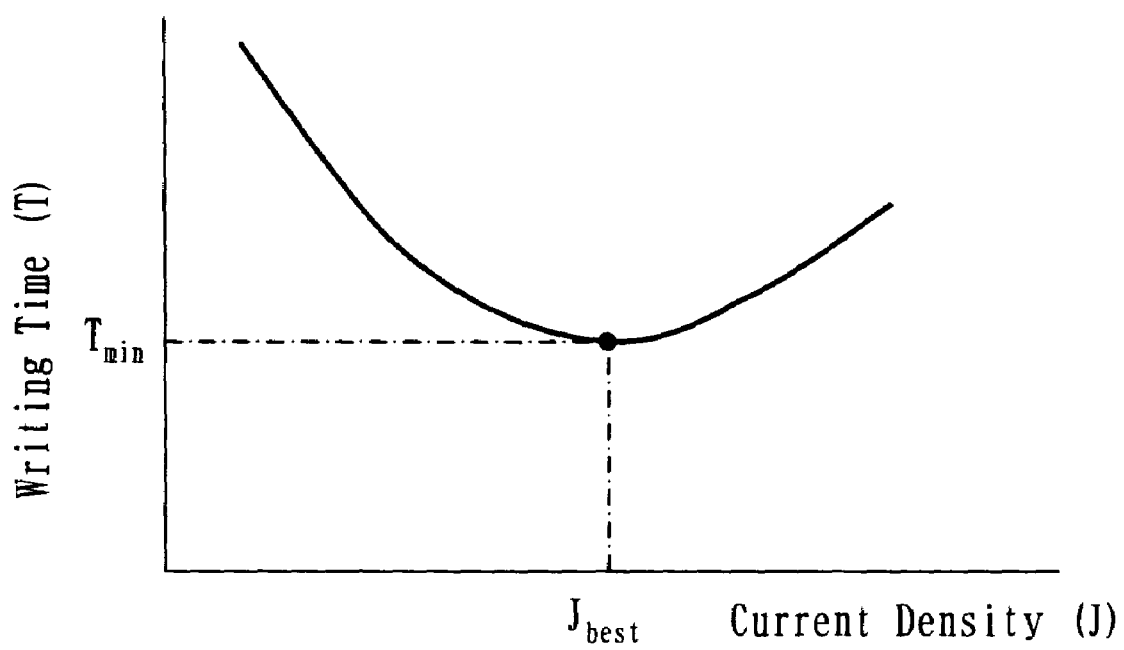
FIG. 13 shows a plot of pattern-writing time vs. current density.

A plot of the pattern writing time T versus the current density J is shown in FIG. 13. As apparent from this graph, it is possible, by selecting appropriate values of the maximum shot size L that causes the total shot number Nshot to be kept constant as shown in FIG. 12 and the current density J of FIG. 11 at such size L, to adjust the writing time T so that it is at the inflexion point, i.e., a minimal writing time Tmin, in the process of increasing the current density J—at the point Tmin the decreasing writing time T changes to increase in value. Accordingly the current density J at this writing-time inflexion point Tmin is determined as the optimum current density Jbest, which ensures accomplishment of the maximum or "best" throughput. Then, find the maximum shot size L at this optimum current density Jbest, which becomes an optimal maximum shot size Lbest.

Although in the graph of FIG. 13 a change curve of the writing time T is plotted with the current density J being as a variable therefor, the maximum shot size L may alternatively be used as such variable. This can be said because the current density J and maximum shot size L are in the relationship which permits the beam current value to stay constant in value, so similar results are obtainable by use of any one of them as the variable.

Figure 14:
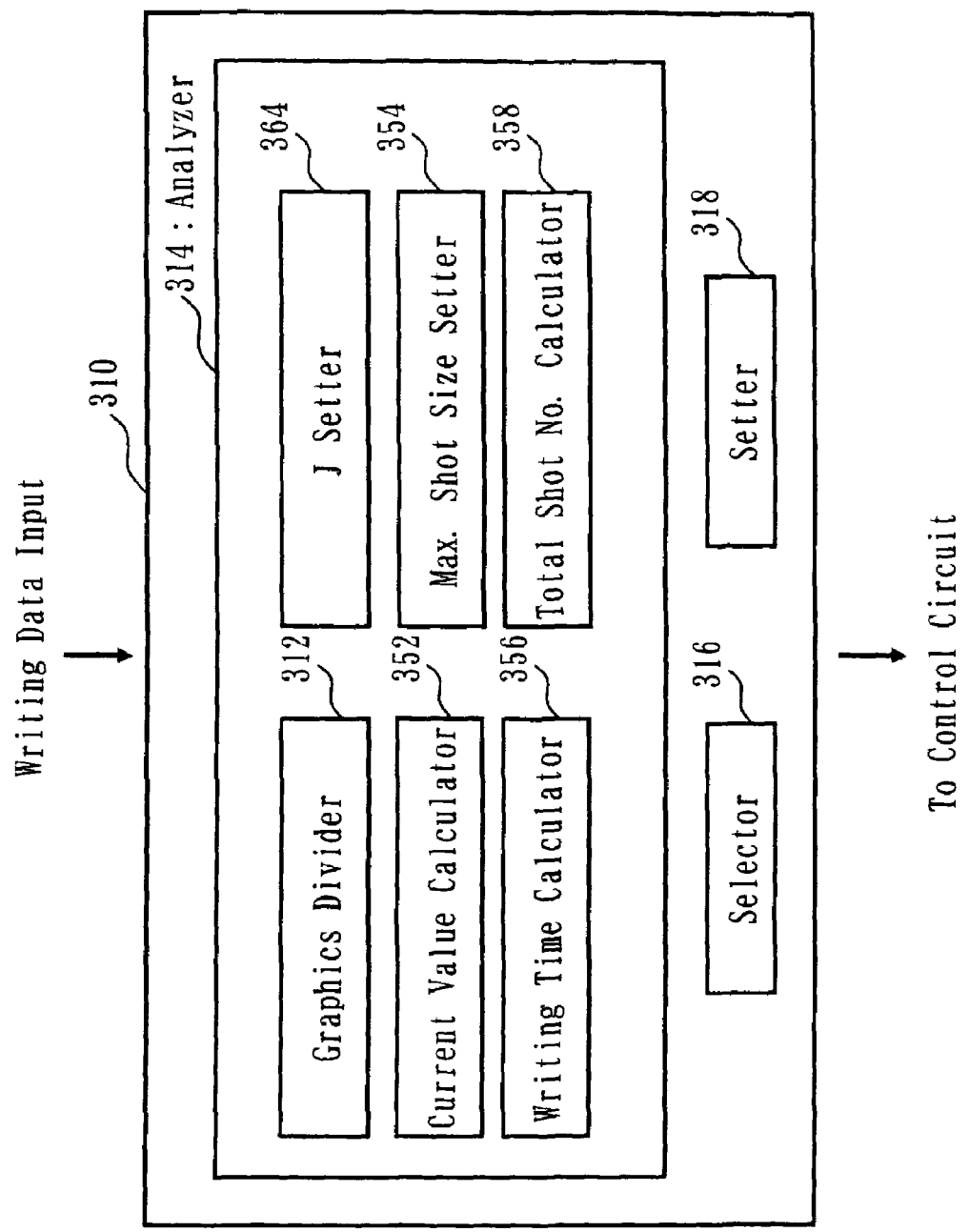
FIG. 14 shows in block diagram form an exemplary internal configuration of a writing data processor circuit.

Turning to FIG. 14, an exemplary internal configuration of the writing data processor circuit 310 of FIG. 1 is partly shown in block diagram form. As shown herein, the writing data processor 310 is generally made up of an analyzer unit 314, a data selector unit 316 and a data setter unit 318. The analyzer 314 includes a graphic/figure dividing unit 312, current value calculator 352, maximum shot size setter 354, writing time calculator 356, total shot number calculator 358, and current density setter 364.

Figure 15:
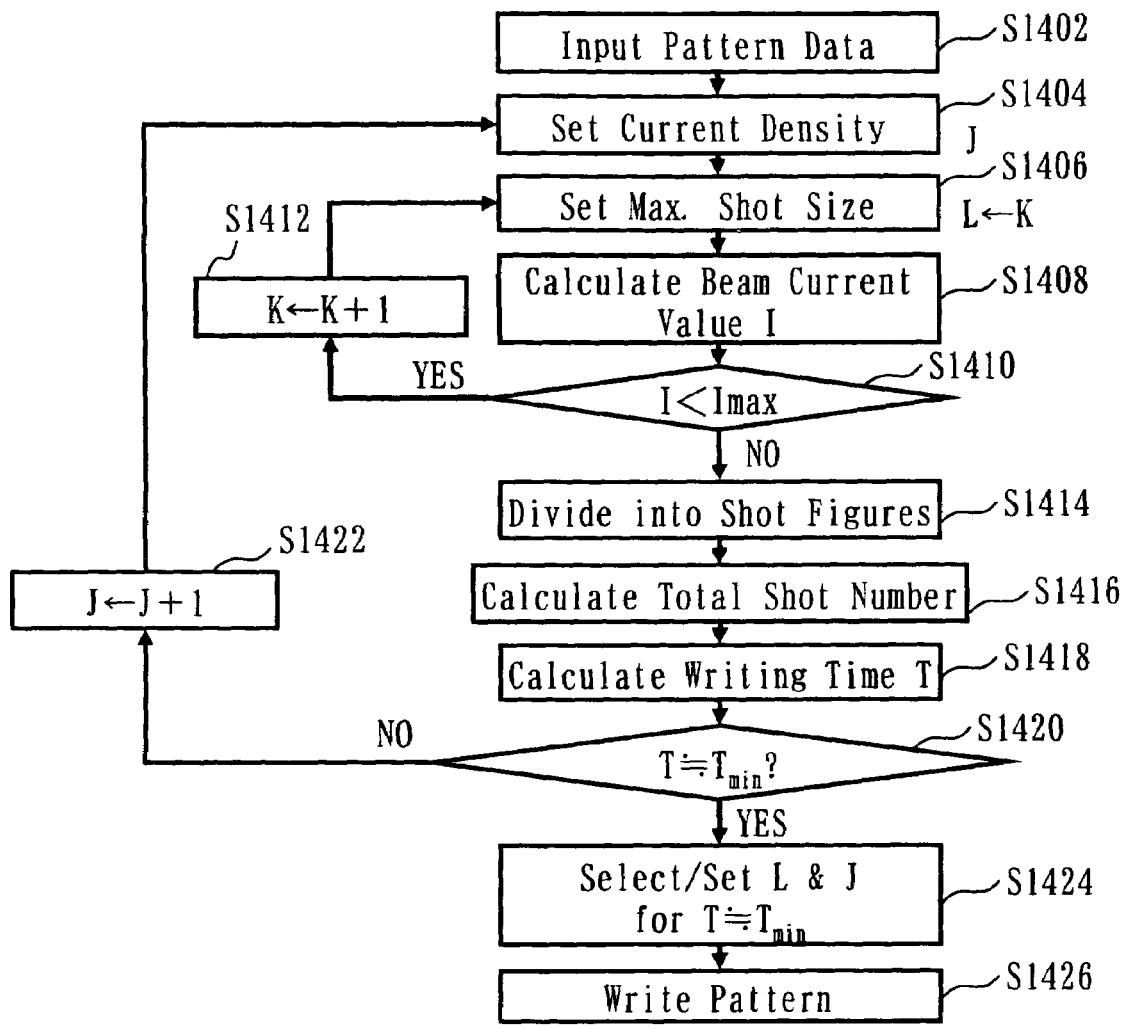
FIG. 15 is a flow chart of an operation of the embodiment apparatus.

As shown in FIG. 15, a system procedure for variable-shaped electron beam pattern writing of this embodiment starts with step S1402, which receives an input writing data indicative of a pattern to be written or "drawn" or "imaged" onto a target workpiece, such as a wafer or else.

Then, the procedure goes to step S1404 which causes the current density setter 364 to set up an initial or "default" value as the current density J. This default current density value setting step is part of an analysis process.

Then, the routine proceeds to step S1406 which permits the maximum shot size setter 354 of FIG. 14 to set a default value K for the maximum shot size L. This maximum shot size setting step is part of the analysis process.

Next, go to step S1408, which causes the current value calculator 352 to determine through computation a beam current value I, thereby letting I=J×L2. This step is part of the analysis process.

At step S1410, the writing data processor circuit 310 compares the calculated beam current value I to a preset maximal beam current value Imax to determine whether the former is less than the latter. This current value judgment step is part of the analysis process. If the value I is less than the preset value Imax, then return to the step S1406 via step S1412 which follows.

At step S1412, the maximum shot size setter 354 causes its built-in adder (not shown) to add a prespecified value—here, one (1)—to the current value K to provide an incremented value K+1, which is then used as an "updated" candidate for the maximum shot size L at step S1406. This addition step is part of the analysis process. After re-execution of the processing at step S1406, the routine again proceeds to the decision step S1410 via the current value calculation step S1408. The addition value at step S1412 should not exclusively be "1" and may be any other values as far as an ability remains to permit the value of maximum shot size L to vary as the variable while achieving the required analyzability of the drawing time T.

The subroutine of from the size setup step S1406 to decision step S1410 will be repeated until the beam current value I becomes equal to the predefined beam current value Imax. At step S1406, attempts are made to redo the setting of the maximum shot size L. By using in combination the resultant current density J and maximum shot size L which are obtained after having affirmed that the beam current value I is equal to the preset beam current value Imax, it is possible to prevent degradation of the beam resolution.

If NO at step S1410 then the routine goes next to step S1414, which causes the graphic divider 312 to subdivide the input writing data into graphical portions each having a shot size in a way pursuant to the maximum shot size L being presently set up. This graphic division step is also part of the analysis process. These resultant graphic portions—say, shot figures—are formed and laid out so that the length of one side edge of a rectangle is less than or equal to the maximum shot size L. Any graphic figures to be shaped in accordance with the shape of an aperture are changeable. For example, shot figures are formable into squares, rectangles or right-angled triangles. For squares and rectangles, let them have side edges each being less than or equal to the maximum shot size L, followed by disposing them in an appropriate layout. As for right triangles, form and dispose them so that the longer one of two adjacent sides crossing together at right angles is not greater than the maximum shot size L.

In step S1416 which is part of the analysis process, the total shot number calculator 358 is rendered operative to count up an exact number of the shot figures that are divided at the previous step S1414, thereby determining through calculation the total shot number needed to write the pattern indicated by the input writing data.

Then, at step S1418 that is part of the analysis process, the writing time calculator 356 determines through computation the length of a time period as required for writing the input writing data pattern. This writing time, T, has a value appropriate for the input draw pattern data, which is calculable by using the presently defined current density J and the total shot number Nshot as calculated at step S1416 in accordance with Equation (4). Usually the settling time Tset and the dose amount DOSE are preset at adequate values.

At step S1420 which is part of the analysis process, the writing data processor circuit 310 determines whether the calculated value of the writing time T is identical to the minimum value $T_{min}$, that is, whether the time value is at the inflexion point whereat the concavity changes as shown in FIG. 13. If NO at step S1420, then proceed to step S1422. If YES then go to step S1424.

At step S1422 in the analysis process, the current density setter 364 uses its built-in adder to add a predetermined value, e.g., 1, to the current density J. The addition value at this step should not exclusively be "1" and may be other values as far as an ability remains to permit the value of current density J to vary as the variable while achieving the required analyzability of the writing time T. Then, return to the current density setup step S1404 which again performs the setting of current density J, followed by execution of the above-stated steps S1404 to S1420 until T=Tmin is verified at step S1420.

Varying the values of the current density J and maximum shot size L in this way makes it possible to finally obtain an "ideal" value of the total shot number Nshot at the value of maximum shot size L as changed while being less than or equal to the preset beam current value Imax. This enables obtainment of the intended value of writing time T from such variable current density J and total shot number Nshot values. More specifically, it is possible to analyze the value of writing time T suitable in compliance with the input pattern data while using as parameters the current density J and maximum shot size L, which are in a relationship that forces the beam current value to stay less than or equal to the preset beam current value Imax.

Thereafter, the routine enters a selection processing stage. More precisely, at step S1424, the selector unit 316 of writing data processor circuit 310 operates based on the analysis results to perform value selection of the current density J and maximum shot size L which cause the writing time T to stay at the inflexion point shown in FIG. 13. At this writing-time inflexion point, the writing time has its minimum value Tmin. To maximize throughputs, the selector 316 is preferably designed to select the current density J and maximum shot size L which cause the writing time T to be at the minimum value Tmin, although such point is not the only one. Similar results are obtainable by selection of other sets of values of the current density J and maximum shot size L which are available when the value of writing time T falls within a specific range including the inflexion point as its center point—i.e., the T value is a vicinity of the minimum value Tmin. In this case also, superior advantages than the prior art are achievable. For example, a range of 10% plus of the minimum value Tmin. to the minimum value Tmin. is desirable as the specific range. Especially, a range of 5% of plus of the minimum value Tmin. to the minimum value Tmin. is more desirable as the specific range.

After completion of the value selection, the value setter 318 sets up the selected current density J and maximum shot size L.

Then, the routine goes to step S1426 which writes a pattern on the workpiece 101 shown in FIG. 1. More specifically, the electron gun 210 in pattern writing unit 150 emits an electron beam 200 with the selected current density J, which is then shaped on a per-shot basis to have a specific shot size that is less than or equal to the maximum shot size L. The shaped electron beam 200 is then irradiated or "shot" onto the workpiece 101 to thereby depict and form thereon a desired pattern corresponding to the input writing data. Once the maximum shot size L is set up, this is notified to the deflection controller 320. In responding thereto, this controller 320 sets up a voltage appropriate for operation control of the deflector 205. This voltage is applied to deflector 205 through digital-to-analog conversion by DAC 332, thereby enabling deflection of the electron beam 200 in a way such that this beam is shaped by the second aperture 206 to have a specific shot size which causes the size of a graphic being shot onto workpiece 101 to be less than or equal to the maximum shot size L. Additionally, upon setting of the current density J, this is sent forth to the electron optics control circuit 342 shown in FIG. 1. This circuit 342 controls the electron gun 201 for adjustment of an emission current and filament temperature to thereby cause the current density J to become equal to the setup value. Alternatively or in addition thereto, the electron optics controller 342 adjusts the focusing of electron beam 200 at the illumination lens 202 to provide control so that the current density J is at the set value. Whether the current density J is at the specified value is verifiable by irradiation of electron beam onto Faraday cup 209.

Although in FIG. 15 one specific case is described which varies the value of current density J with the maximum shot size L as a variable, the current density J may alternatively be varied as the variable with respect to the maximum shot size L.

By varying the current density J and maximum shot size L in a way pursuant to a pattern to be written in the way stated supra, it is possible to obtain the best possible throughput.

Although it has been stated that the value change of the maximum shot size L is achieved by control of the deflector 205 on a software or hardware basis so that the electron beam 200 varies in deflection position, similar results are obtainable by replacement of either one or both of the first and second apertures 203 and 206 of FIG. 1.

A procedure for the aperture replacement will be discussed with reference to FIG. 16. Supposing that several first apertures are replaceably disposed in an aperture cassette (not shown). One of such first apertures, 213, is replaced by another first aperture 223, thereby to change an opening 214 to another opening 224 that is different in size therefrom. For example, the opening 214 is a rectangle, and the opening 224 replaced is a rectangle that is smaller in each side than opening 214 with the center being the same in position as that of the former, resulting in a decrease in deflection amount of the electron beam 200 falling onto a variable shaping opening 217 of second aperture 216 in the event of beam shaping by use of the maximum shot size. Such deflection reduction causes the settling time to become shorter, thereby enabling shortening of the writing time.

Figure 16:
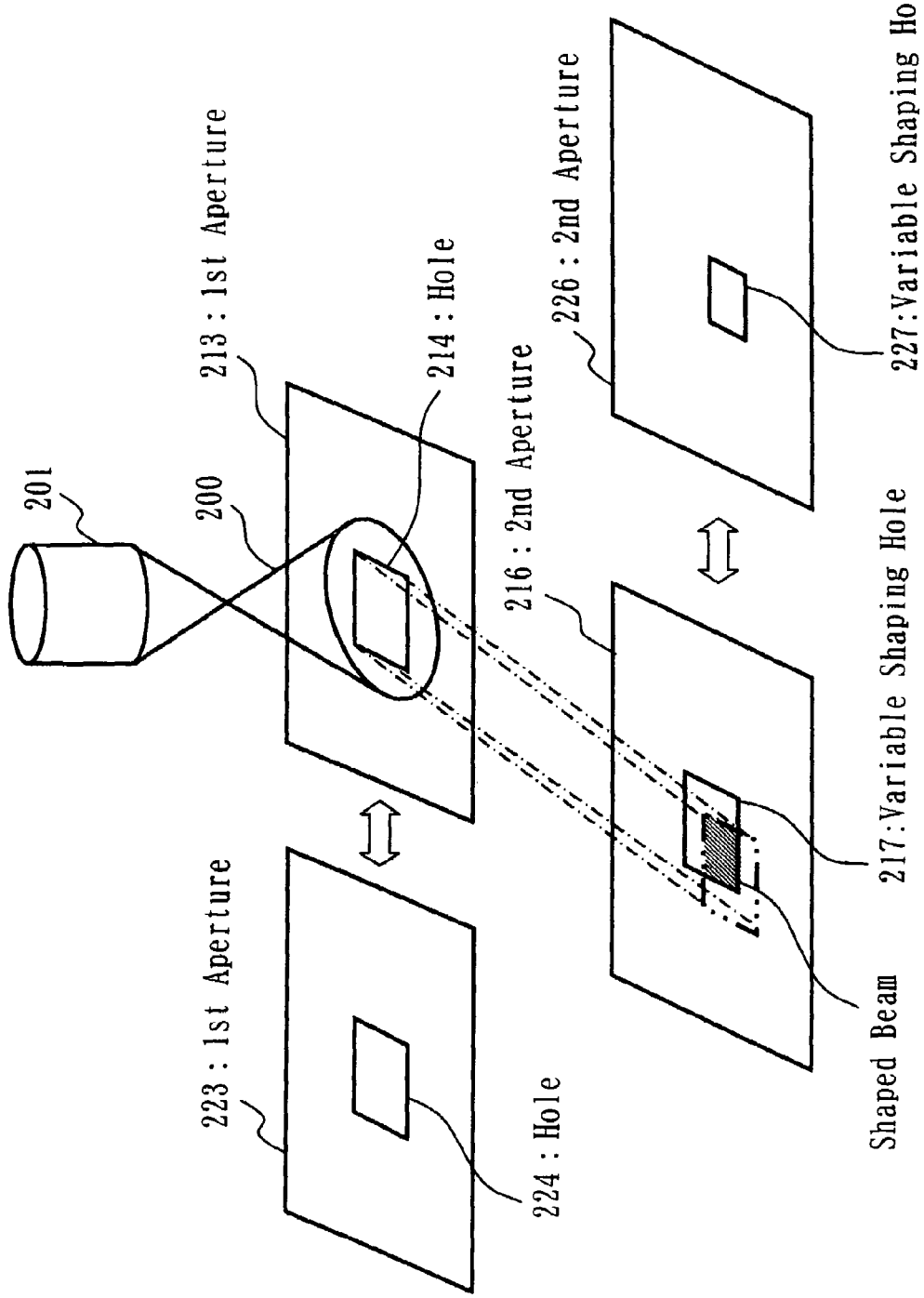
FIG. 16 is a pictorial representation of a procedure for exchange between aperture plates.

Alternatively in FIG. 16, several second apertures are replaceably disposed in a cassette (not shown).

One of such second apertures, 216, is replaced with another second aperture 226, thereby changing a variable shaping opening 217 to another variable shaping opening 227 that is different in size therefrom. For instance, the opening 217 is a rectangle, and the opening 227 replaced is a rectangle that is smaller in each side than opening 217 with the center being the same in position as that of it, resulting in a decrease in deflection amount when shooting electron beam 200 to the variable shaping opening 227 of aperture 226 in the event of beam shaping with the maximum shot size. Such deflection reduction causes the settling time to become shorter, thereby enabling shortening of the drawing time.

Both the first and second apertures 213 and 216 are replaceable at a time by the first and second apertures 223 and 226, respectively. By lessening both the beam-shaping openings while letting respective aperture centers stay at the same position, it is possible to further decrease the deflection amount upon shooting of the electron beam 200. This results in a further decrease in settling time, thereby enabling further shortening of the writing time T.

Figure 17:
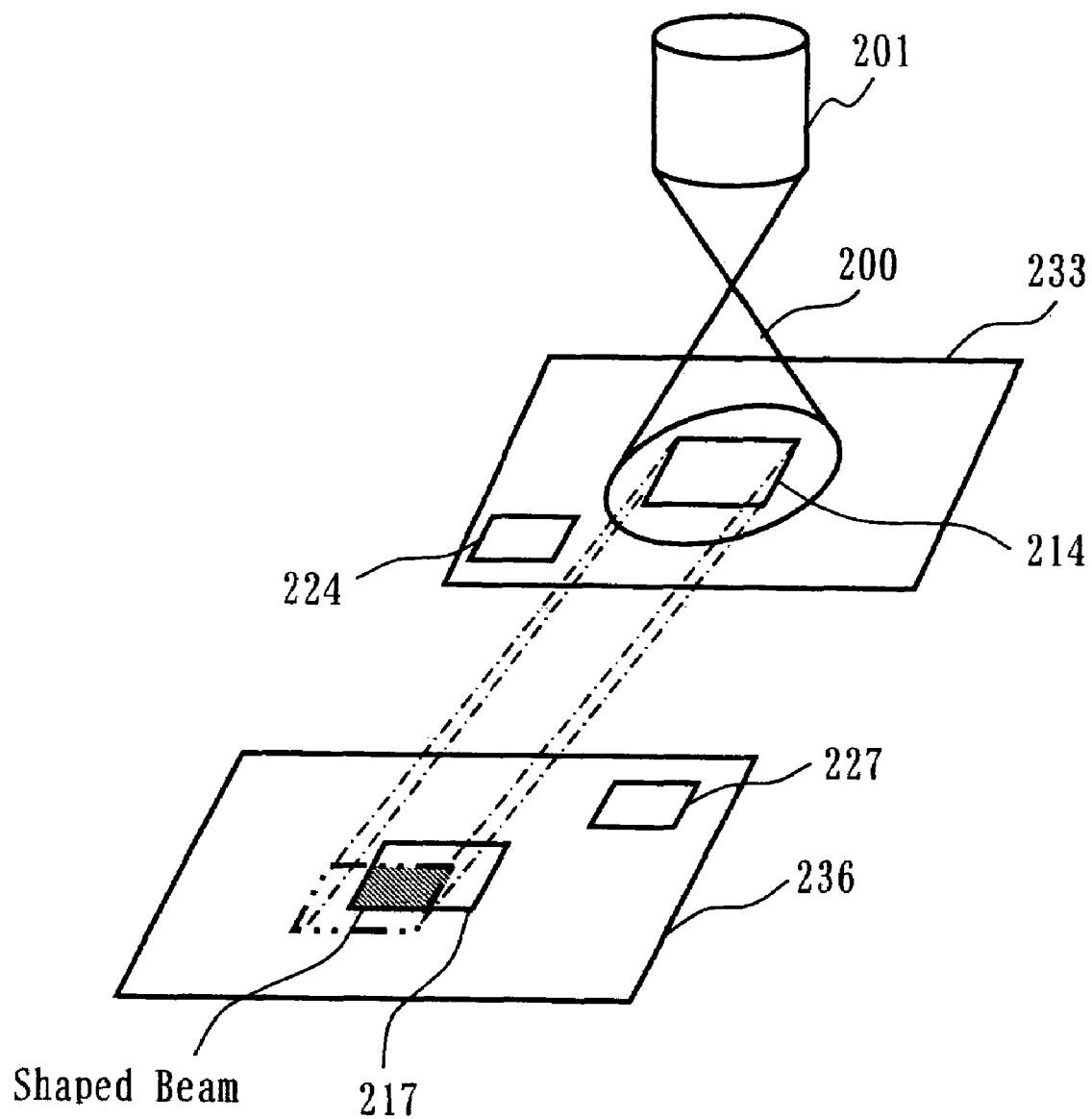
FIG. 17 shows aperture plates for opening replacement.

Although in the example of FIG. 16 the apertures themselves are replaced with others, an alternative approach is employable, which provides an aperture plate having more than two beam-shaping holes at different locations while permitting one of them to be used interchangeably. More specifically, as shown in FIG. 17, a first aperture 233 and second aperture 236 are provided, either one or both of which is/are arranged to have rectangular holes that are different in size from each other for achieving the changeability of maximum shot size L. For example, the first aperture 233 has a large rectangular hole 214 and small hole 224. Similarly second aperture 236 has a large rectangular hole 217 and small hole 227. For each aperture plate, changing between the holes makes it possible to vary the maximum shot size L.

This hole change is accomplishable by use of an aperture driver (not shown) or alternatively by control of the deflection position of electron beam 200 for changing its irradiation position.

The variable shaping holes of first and second apertures should not exclusively be limited to rectangles and may be other shapes as far as these enable formation of a desired shot shape.

Embodiment 2

While the first embodiment stated above is arranged to perform value setup by selecting in combination the current density J and maximum shot size L which minimize the writing time T, similar results are obtainable by selection of a maximal shot area S in place of the maximum shot size L. A variable-shaped electron beam pattern writing/exposure method and an apparatus for use therewith in accordance with a second embodiment of the invention are arranged to incorporate this principle, although detailed explanations thereof are eliminated herein as these are understandable from the description of the first embodiment while reading it by changing the term "maximum shot size L" to "maximum shot area S."

The current density J is given by a beam current value I per unit area. Additionally, as previously stated, the degree of beam defocusing or increasing of beam blur due to space charge effects is variable depending on the beam current value I. Letting the maximum beam current value Imax without any increasing of beam blur be Imax, the maximum shot area S—i.e., a shot area that is maximized while preventing degradation of the space charge effect-increasing beam blur—is given as S=Imax/J in each shot under an assumption that the current density J is kept constant. In light of this, the beam defocus degradation is avoidable by setup of such specific maximum shot area S (=Imax/J) and then graphic division while letting it be less than or equal thereto, resulting in the per-shot beam current value I being less than or equal to the preset value Imax. This enables accomplishment of increased beam resolution acceptable for practical applications.

Figure 18:
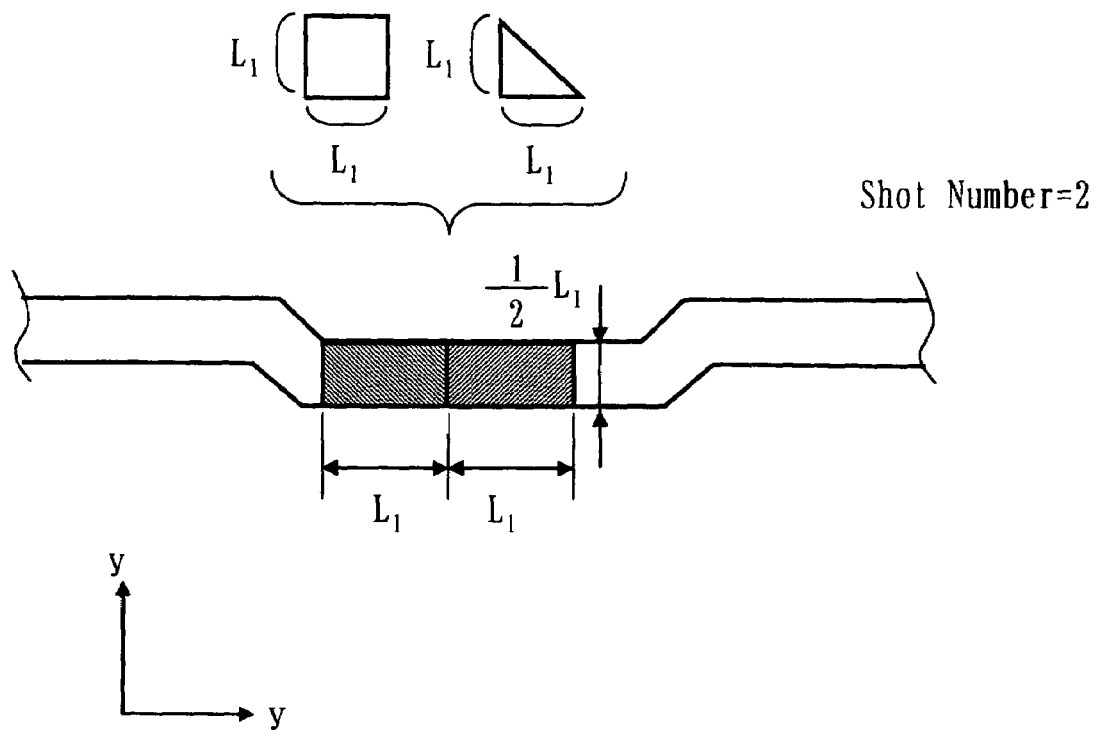
FIG. 18 shows an enlarged plan view of a pattern to be written while defining a maximal shot size therefor.

A technique for writing a pattern by defining the maximum shot size L is as follows. As shown in FIG. 18, suppose that the maximum shot size L is set to L1. Assume that the pattern of interest is a line pattern segment having its width less than the value L1, e.g., half of L1. In this case, the pattern is divided into portions (shot figures) having a lateral size along the "x" direction of L1 and a longitudinal size in "y" direction of L1/2. These portions are indicated by hatching in FIG. 18. Obviously, shooting an electron beam thereto needs execution of two separate shot processes.

Figure 19:
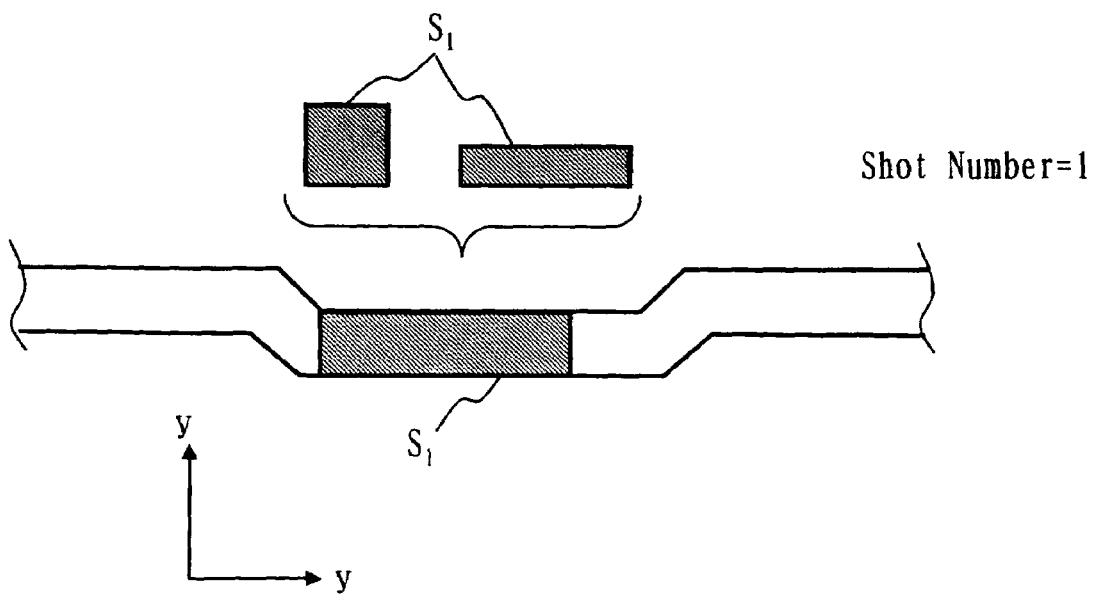
FIG. 19 is an enlarged plan view of a pattern to be written while defining a maximal shot area.

Another example is shown in FIG. 19, which shows a similar line pattern that is subjected to pattern writing with the definition of a maximal shot area S. This area S is defined equal to the area S1 of a square segment with its each side length being equal to the maximum shot size L1 of FIG. 18. Suppose that the line pattern has a width which is less than the value L1, e.g., one-half of it. When looking at its portion indicated by hatching in FIG. 19, this is divided into shot figures of different shapes each having the same area S1. Hence, shooting a beam onto the hatched portion can be done by a mere single shot.

Accordingly, defining the maximum shot area S in place of the maximum shot size L makes it possible to reduce the total shot number.

Figure 20:
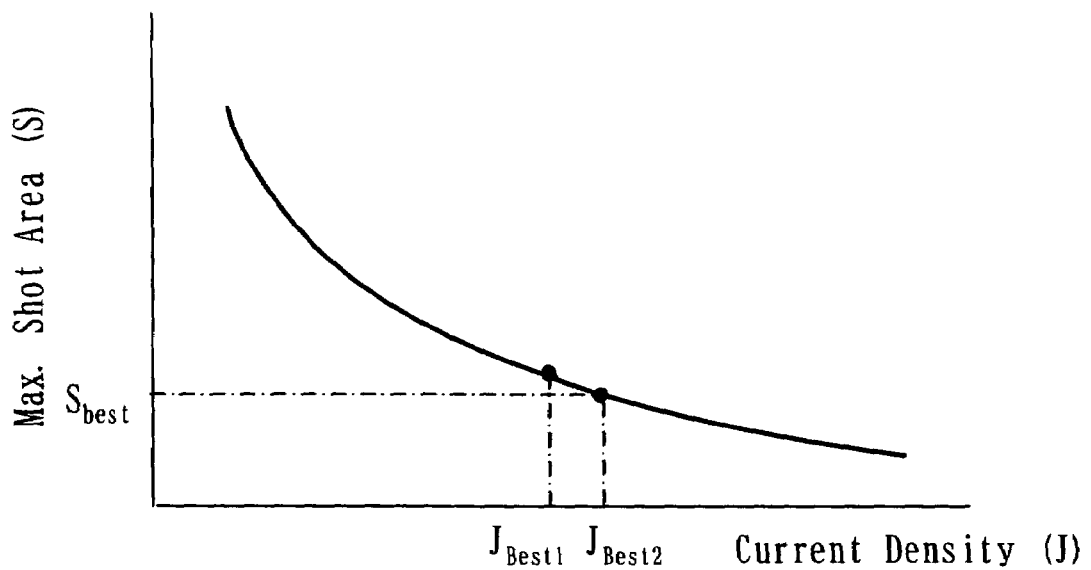
FIG. 20 is a graph showing a curve of maximum shot area versus current density.

A curve of the maximum shot area S versus current density J is shown in FIG. 20. As shown in this graph, when setting the maximum shot area S and the current density J so that these are in a certain relationship which causes the beam current value I to stay at a preset value, the larger the current density J, the smaller the maximum shot area S.

Figure 21:
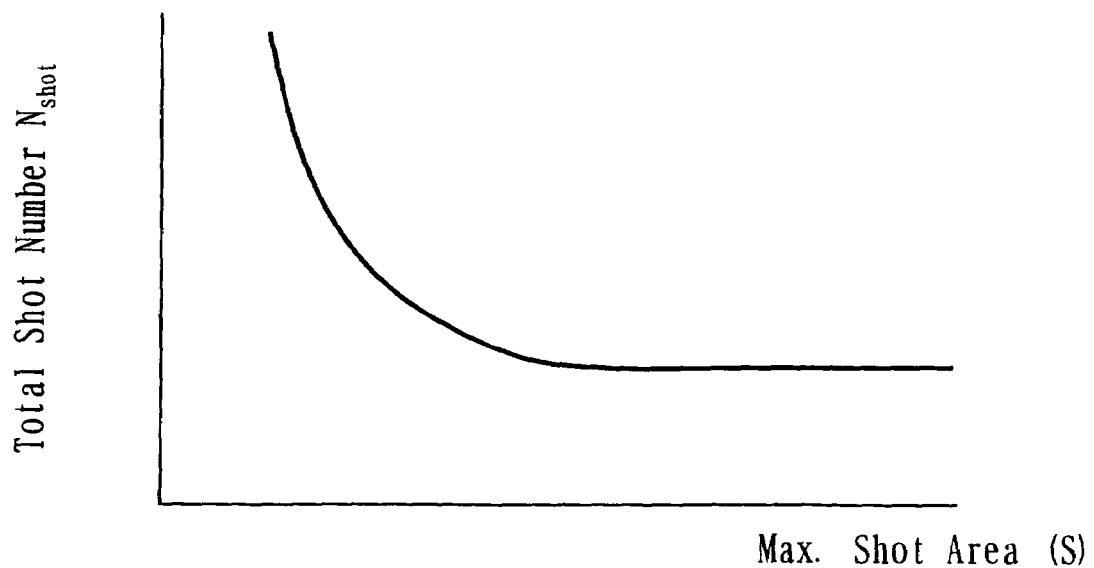
FIG. 21 is a graph showing a plot of total shot number vs. maximum shot area.

A plot of total shot number Nshot versus maximum shot area S is shown in FIG. 21. As shown, when the maximum shot area S is lessened in value, the total shot number Nshot generally is kept almost unchanged until the area value S reaches a specific point.

Figure 22:
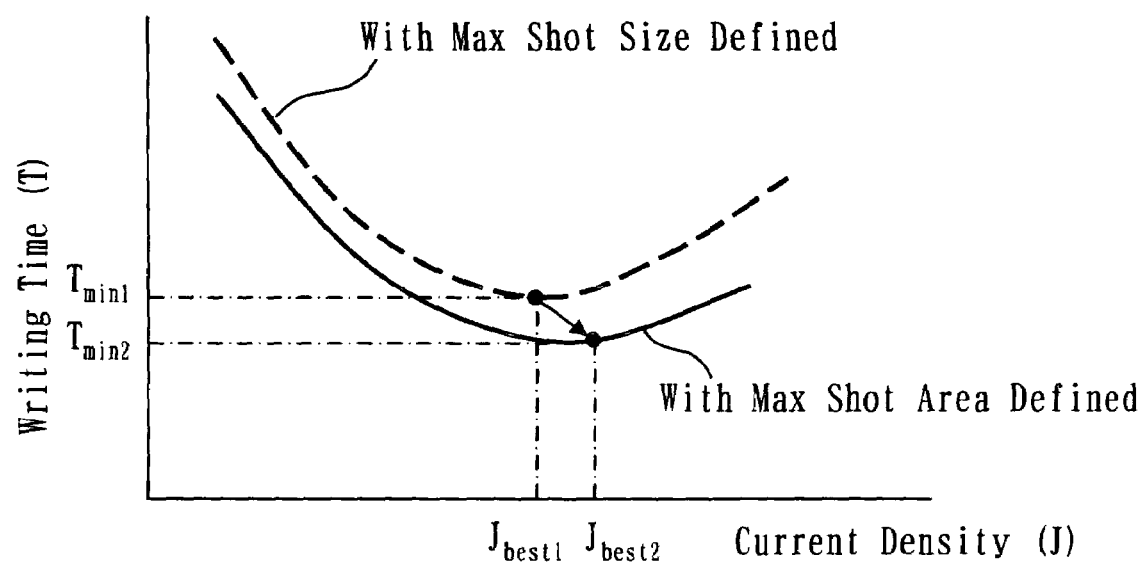
FIG. 22 shows curves of writing time vs. current density.

Curves indicating writing time versus current density characteristics are plotted in FIG. 22. A specific value of the maximum shot area S is selected which falls within the "constant value" range of the total shot number Nshot shown in FIG. 21. Also select the current density J shown in FIG. 20 at the selected value of maximum shot area S. These value settings make it possible to adjust the writing time T to the inflexion point (i.e., minimum writing time Tmin) at which the decreasing writing time T turns to increase in the process of increasing the current density J. Thus, the current density value J at such inflexion point becomes an optimal current density Jbest2 which ensures achievement of the best possible throughput. The value of maximum shot area S at this optimum current density Jbest2 is an optimal shot area Sbest.

As the maximum shot area S is defined as an alternative to the maximum shot size L, the resulting total shot number Nshot decrease, so the writing-time inflexion point is shiftable downward as shown in FIG. 22. Thus it is possible by defining the maximum shot area S to provide a minimal writing time Tmin2 that is made shorter than the minimum writing time Tmin1 in the case of defining the maximum shot size L. To maximize throughputs, the selector 316 is preferably designed to select the current density J and the maximum shot area S which cause the writing time T to be at the minimum value Tmin2, although such point is not the only one. Similar results are obtainable by selection of other sets of values of the current density J and the maximum shot area S which are available when the value of writing time T falls within a specific range including the inflexion point as its center point—i.e., the T value is a vicinity of the minimum value Tmin2. In this case also, superior advantages than the prior art are achievable. For example, a range of 10% plus of the minimum value Tmin2. to the minimum value T min2. is desirable as the specific range. Especially, a range of 5% of plus of the minimum value Tmin2. to the minimum value Tmin2. is more desirable as the specific range.

Although in FIG. 22 a change of the writing time T is shown with the current density J being as a variable, such change in the writing time T may alternatively be shown with the maximum shot area S as the variable. Since the current density J and maximum shot area S are set in the specific relation which forces the beam current value to stay at a preset value, similar results are obtained by use of any one of them.

In the second embodiment, the value of the current density J of an electron beam to be shot in accordance with input pattern data and the value of maximum shot area S are specifically selected so that the writing time T is at its minimum value or at approximate values thereof. After this value selection, the pattern writing unit 150 creates an electron beam with the current density thus selected, which beam is shaped to have a shot area less than or equal to the maximum shot area S and is then shot onto a target workpiece so that a pattern of the input data is written or "drawn" thereon. With such an arrangement, it is possible to increase the throughput while at the same time suppressing degradation of the beam resolution.

Embodiment 3

While in the above embodiments the current density J is set so that the beam current I flowing in a region of either the squared value of maximum shot size L or the maximum shot area S becomes equal to a specific value which avoids degradation of the beam resolution, every shot area does not always become such expected area when consideration is given for respective shots. In view of this, it is also preferable to vary the current density J on a per-shot basis. One desirable approach is to vary the current density J pursuant to each shot size or each shot area in a way such that the value I of a beam current being shot onto a workpiece 101 is in maximal proximity to a preset beam current value Imax without the risk of beam resolution degradation while letting the former be less than the latter.

Varying the current density J in deference to each shot size or area makes it possible to increase the current density of a shot having its area less than either the squared value of the maximum shot size or the maximum shot area. This results in appearance of a shot capable of shortening the shot time, which is contributed to the shortening of the writing time. An electron beam photolithography apparatus incorporating this principle in accordance with a third embodiment of the invention is similar in hardware configuration to that of the embodiments stated previously, so its detailed explanation will be eliminated herein.

Embodiment 4

Each of the embodiments stated above is such that the beam current value Imax is set in advance to a unique value irrespective of the kinds of patterns to be written. However, the invention should not exclusively be limited thereto. Several patterns being written on a mask or wafer or else include a pattern without a need for high accuracy. Respective arrangements in a fourth embodiment may be similar to those in the previous embodiments, so explanations thereof will be omitted here.

Figure 23:
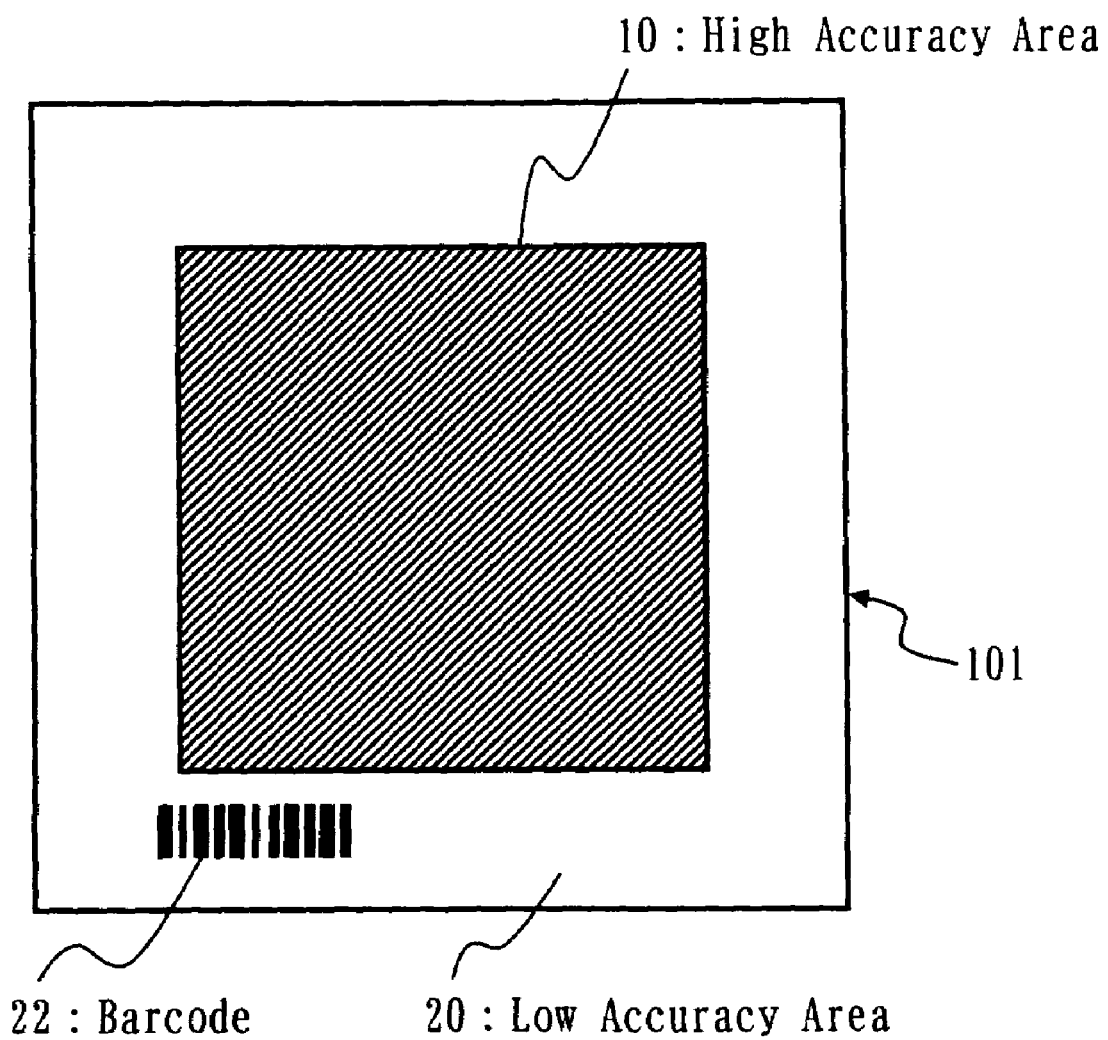
FIG. 23 shows an exemplary workpiece on which a pattern is to be written.

See FIG. 23. This diagram shows a plan view of an exemplary workpiece 101 to be subjected to the pattern writing. As shown, a pattern to be written on the workpiece 101 has a central region 10 which is required to have a high accuracy level and is under the requirement for precision compensation and a peripheral region 20 that is relatively low in precision. For example, in case the workpiece 101 is a mask used to fabricate highly integrated semiconductor circuitry on wafers, higher precision is required for a region in which is formed a semiconductor circuit pattern(s). On the contrary, an identification code pattern that permits users to identify this mask is free from strict precision requirements. Examples of the precision-free pattern are a bar code 22 shown in FIG. 23, numerals, ID number, date and serial number (S/N). Barcode 22 is to be optically read by a barcode reader and thus may be roughly sized as far as users can visually recognize it. The others, such as the numerals, ID number, date and serial number (S/N), are merely visually recognized by users, so these may be sized to permit users to do so. For these patterns with such rough sizes, high accuracy is not required, so it is possible to enlarge the beam current value Imax. For example, let it be two times greater than the beam current value Imax used for the high accuracy-required region 10.

Consequently, in the fourth embodiment, the beam current value Imax is made variable in compliance with a to-be-written region or pattern. Varying it depending on the precision required makes it possible to shorten the writing time.

Figure 24:
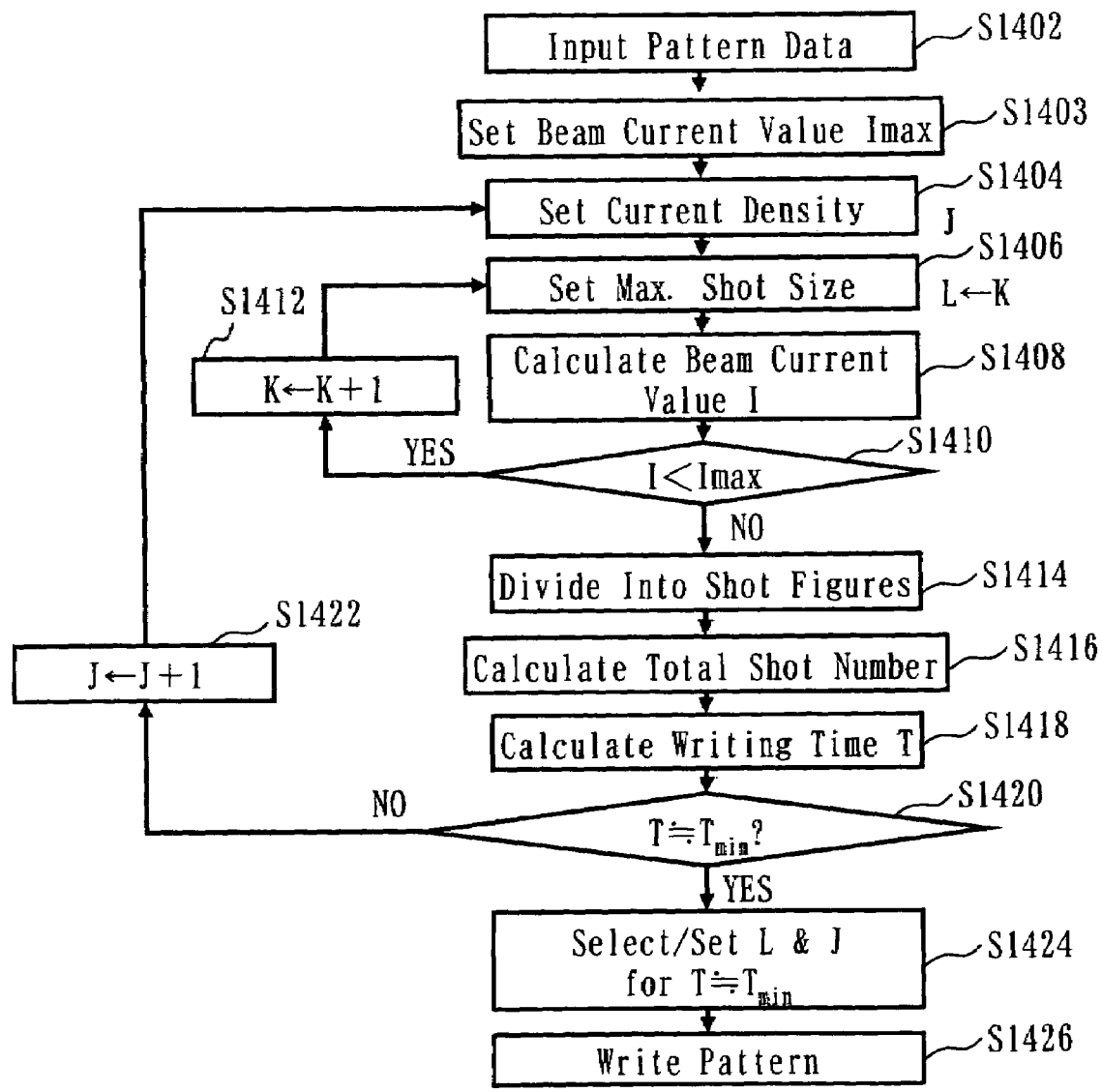
FIG. 24 is a flowchart of an electron beam (EB) photolithographic pattern writing method also embodying the invention.

As shown in a flowchart of FIG. 24, a system procedure of the fourth embodiment starts with step S1402, which causes the writing data processor circuit 310 of FIG. 1 to receive an input pattern writing data in a similar way to that shown in FIG. 15.

The procedure goes next to step S1403, which permits the writing data processor 310 to set up a default beam current value. At this step, the maximum beam current value Imax is set up in accordance with a writing region, pattern kind and pattern accuracy level or else, unlike the previous embodiments which are arranged so that the maximum beam current value Imax is preset to a unique value irrespective of the kind of a pattern to be written.

Figure 25:
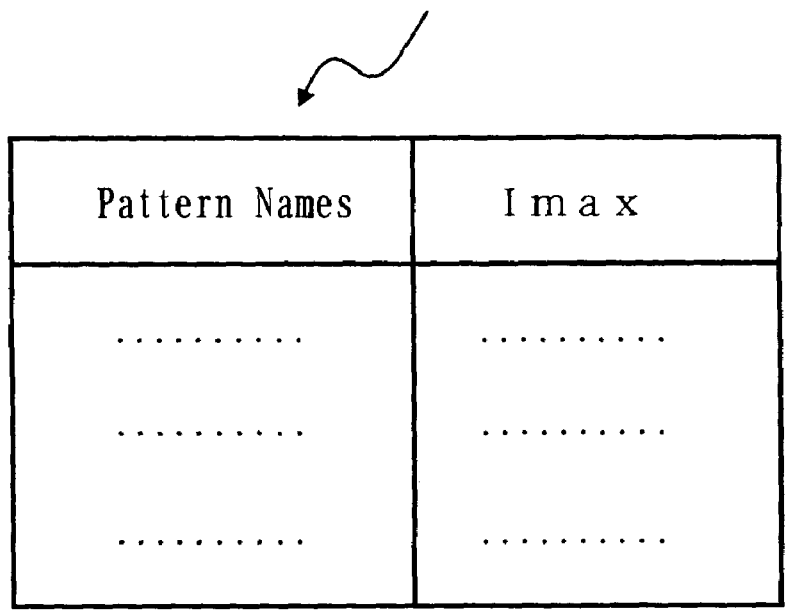
FIGS. 25-26 are diagrams each showing an exemplary correspondence table.

As shown in FIG. 25, a predetermined one-to-one correspondence relation between a pattern identifier indicative of pattern names or the like and the beam current value Imax to be used therefor is prepared in advance in the form of a "look-up" table 30. In a column of this table, several patterns to be written in the high-accuracy-required area 10 and low-precision area 20 shown in FIG. 23 are distinguished in name from each other. Then, the writing data processor circuit 310 extracts such pattern identifiers from the input pattern data for setup of its corresponding value of maximum beam current value Imax.

Then, the routine proceeds to step S1404, at which the current density setter 364 sets up a default value for the current density J. The following steps S1406 through S1426 are similar to those shown in FIG. 15.

By setup of the beam current value Imax in accordance with the pattern to be written, the selector 316 selects the value of each shot size or shot area and the current density J for co-use therewith in such a way that the electron beam is nor greater in its current value than the beam current value Imax thus determined. In other words, while varying the maximum beam current value Imax to be determined depending on pattern data, the selector 316 sets up the current density J and the maximum shot size L or area S so that the electron beam current is less than or equal to the value Imax. In this way the selector 316 performs the value setting in units of patterns to be written on the target workpiece 101. With such an arrangement, it is possible to further shorten the drawing time T.

Figure 26:
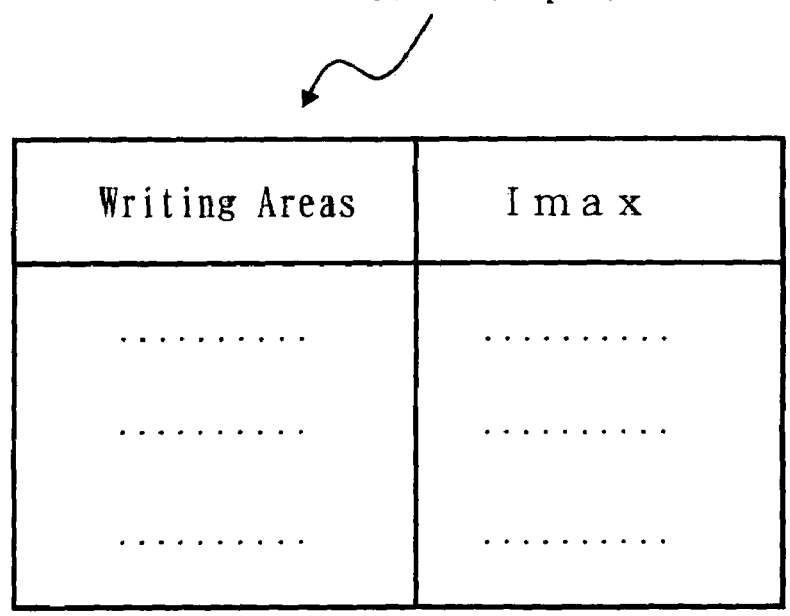
Figure 27:
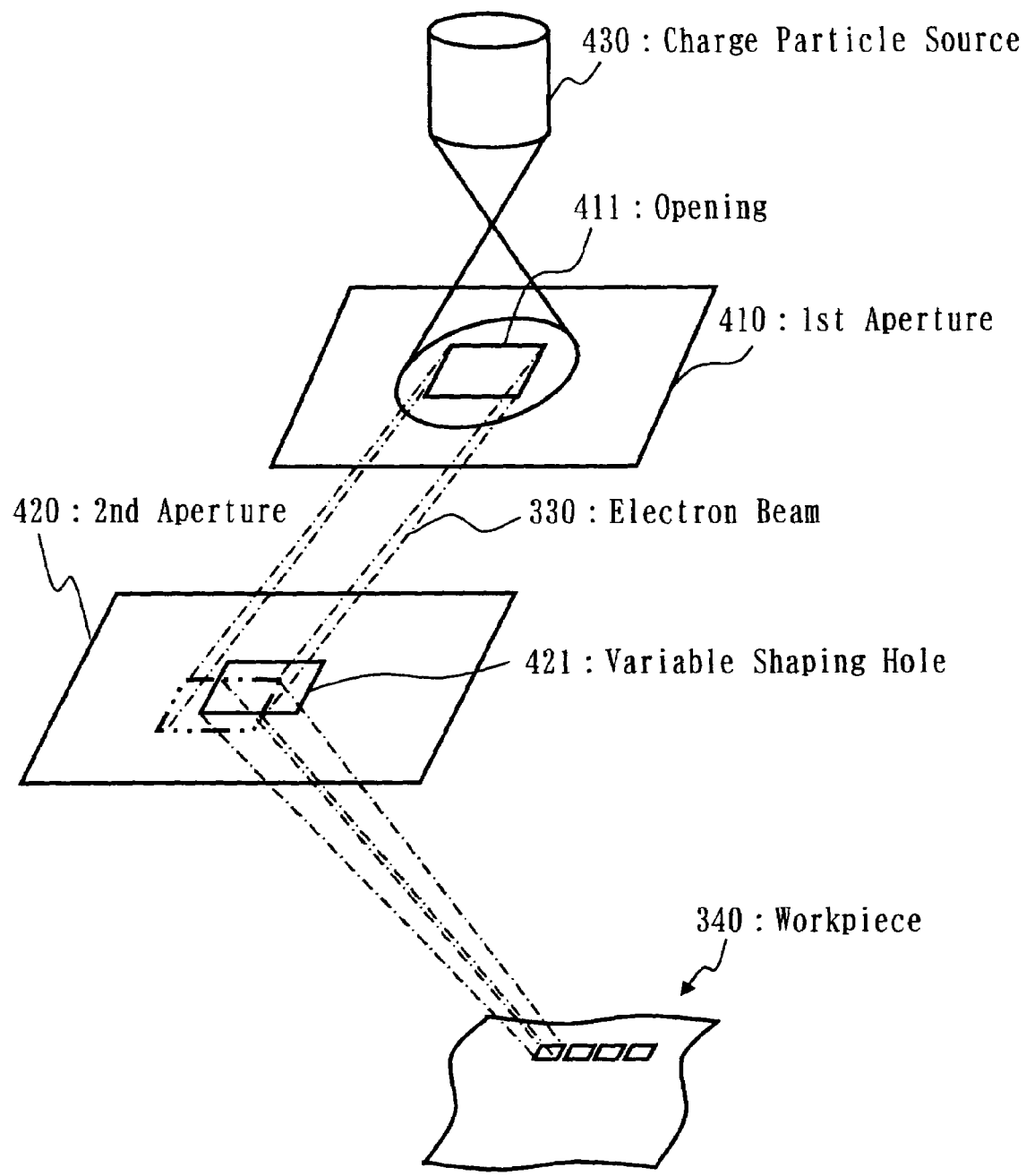
FIG. 27 is a diagram schematically showing major components of a prior known variable-shaped electron beam exposure tool.

The pattern name versus Imax correspondence table 30 shown in FIG. 25 may be replaced by a table 30 shown in FIG. 26. This table indicates in a one-to-one correspondence way the relation between writing areas and values of the beam current value Imax. With use of this table, it is possible for the writing data processor 310 to determine the maximum beam current value Imax directly from an area or region to be subjected to the pattern writing.

While letting the exposure surface of workpiece 101 be virtually divided into a plurality of pattern-writing regions, the beam current value Imax to be set per region is made variable in the way stated above. Then, the setter 316 selects the current density J and the maximum shot size L or area S so that an electron beam being shot per region has its current value less than or equal to the value thus selected. With this arrangement also, it is possible to lessen the writing time.

Although in FIG. 23 one specific example was discussed for division into the high-accuracy pattern area 10 and low-accuracy area 20, the invention is not limited thereto. For example, it is also preferable to set the beam current value Imax per strip region while making variable the beam current value Imax to be determined per strip region. This is effective because some strip regions can be different in pattern accuracy level from each other. Using the "Imax variable" scheme for selecting the current density J and the maximum shot size L or area S so that the beam has its current value less than or equal to the per-region determined beam current value, it is possible to shorten the writing time.

As apparent from the foregoing discussions, the pattern writing apparatus in accordance with the first embodiment is characterized by including a selector unit operable to receive input data of a pattern to be written by shots of an electron beam and then select based on the input pattern data a current density of the electron beam being shot and a maximal shot size thereof, and a pattern writing unit for creating the electron beam with the current density as selected by the selector unit and for shaping the formed electron beam to have its shot size that is less than or equal to the maximal shot size in units of shots, which beam is then irradiated or "shot" onto a workpiece to thereby write the pattern required.

It has been stated that the invention provides a technique for appropriately determining in a way pursuant to pattern data the beam current density and the maximum shot size which optimize the throughput while suppressing degradation of the beam resolution. The best possible throughput is accomplishable by selecting the "best" combination of such current density and maximum shot size values in compliance with the writing pattern data and then using these values to write a pattern(s).

Another important feature lies in that the selector unit is arranged to select the current density and maximum shot size in a way such that even upon inputting of different pattern data, an electron beam being shot onto a workpiece which is shaped to less than or equal to the maximum shot size has its current value less than or equal to the preset value.

By selecting the specific current density and maximum shot size values so that the beam current value is not greater than the preset value, it is possible to avoid unwanted occurrence of degradation of the beam resolution (i.e. beam defocusing or blur) otherwise occurring due to space charge effects.

In addition, the above-stated pattern writing method of the first embodiment is featured by including the steps of analyzing the value of a writing time adequate for pattern data while using as variables a current density and maximal shot size which are in the relation that a beam current is less than or equal to a preset value, selecting based on an analysis result the values of the current density and maximal shot size which cause the writing time to fall within a range in which its value changes in rate of change, and shooting an electron beam onto a workpiece while letting its shot size be less than or equal to the selected current density and maximal shot size to thereby write a pattern as indicated by the pattern data.

Performing the analysis process makes it possible to exactly specify how the writing time varies in value. By the selection of the current density and maximal shot size which permit the value of writing time is within a limited range including the inflexion point at which the concavity changes, i.e., the decreasing draw-time value changes to increase, it is possible to improve the throughput in the pattern writing process.

The pattern writing apparatus of the second embodiment stated supra is featured by including a selector unit responsive to receipt of input data of a pattern to be formed by shots of an electron beam for selecting a current density of the electron beam being shot and a maximal shot area thereof, and a pattern writing unit for creating or "forming" an electron beam with the current density selected by the selector unit and for shaping the created electron beam into a shot area less than or equal to the maximal shot area in units of shots and then irradiating the shaped electron beam onto a workpiece to thereby write the pattern.

Using the maximum shot area in place of the maximum shot size makes it possible to reduce a total number of beam shots.

The pattern writing apparatus of the third embodiment stated supra is arranged to use a plurality of shot-size variably shaped electron beams to write a specified pattern or patterns on a workpiece, which apparatus is featured in that the beam being shot onto the workpiece has a current value which is made variable in current density in a way pursuant to each shot size so that the beam current value in each shot is less than or equal to a preset value.

Varying the current density on a per-shot basis makes it possible to maximize the value of the current density while at the same time avoiding occurrence of any appreciable space charge effects. This enables further shortening or cut-down of a shot time required.

It has been stated that the embodiments above are capable of using the best possible combination of current density and maximal shot size or area which is chosen to maximally increase the throughput while suppressing degradation of the beam resolution. This in turn makes it possible to achieve better throughputs then ever before.

The parts or components as expressed by "units" in the above description may also be configured by computer-executable software programs or any combinations with hardware or firmware or both. Such software programs are storable or recordable on recording media, such as magnetic disk devices, magnetic tape recorders, floppy diskettes (FDDs) or read-only memories (ROMs) or equivalents thereto. Additionally the input data and/or output data stated previously may be stored in storage devices, such as a register or memory or else. Each arithmetic processing may be done by use of an adder or multiplier or the like.

It must be noted that in case the maximum shot size L in the first embodiment is replaced by the maximum shot area S, the current value calculator 352 of FIG. 1 operates to compute the beam current value I=J×S, rather than I=J×L2.

While this invention has been particularly shown and described with reference to specific embodiments, the invention should not exclusively be limited thereto.

Although explanations are omitted of apparatus components and control schemes which are deemed unnecessary for discussion of the principles of the invention, these are realizable by using known appropriate ones on a case-by-case basis. For example, regarding the configuration of the system controller for control of the variable-shaped electron beam (EB) writing apparatus 100, its detailed explanation is eliminated as such is achievable by adequate use of controller arrangements ad libitum.

Any other pattern writing/imaging systems and methods which incorporate the principles of the invention and which are modifiable through design changes by skilled persons are included in the coverage of the invention.

Additional advantages and modifications will readily occur to those skilled in the art. Therefore, the invention in its broader aspects is not limited to the specific details and representative embodiments described and illustrated herein. Various modification and alterations may be made without departing from the spirit and scope of the general inventive concept as defined by the appended claims and their equivalents.

What is claimed is:

1. A writing apparatus comprising:
   a selector unit responsive to receipt of input data of a pattern to be written by shots of irradiation of an electron beam, configured to select a current density of the electron beam being shot and a maximal shot size thereof based on the input data of the pattern to be written; and
   a writing unit configured to create an electron beam with the current density selected by said selector unit, shape the created electron beam into a shot size less than or equal to said maximal shot size in units of the shots, and shoot the shaped electron beam onto a workpiece to thereby write said pattern, wherein said selector unit is configured to select the current density and the maximal shot size in such a way that, even upon input of different pattern data, a beam current value for shooting onto the workpiece the electron beam as shaped to have its size being less than or equal to the maximal shot size is less than or equal to a preset value.

2. A writing apparatus, comprising:
   a selector unit responsive to receipt of input data of a pattern to be written by shots of irradiation of an electron beam, configured to select a current density of the electron beam being shot and a maximal shot size thereof based on the input data of the pattern to be written; and
   a writing unit configured to create an electron beam with the current density selected by said selector unit, shape the created electron beam into a shot size less than or equal to said maximal shot size in units of the shots, and shoot the shaped electron beam onto a workpiece to thereby write said pattern,
   wherein said selector unit is configured to select the current density and the maximal shot size so that a beam current value for writing become less than or equal to a beam current value to be set in accordance with the input data of the pattern to be written.

3. The apparatus according to claim 1, wherein said workpiece has a surface as virtually divided into a plurality of pattern-writing regions and wherein said selector unit is configured to select the current density and the maximal shot size in units of the regions.

4. The apparatus according to claim 3, wherein said selector units is configured to select the current density and the maximal shot size so that a beam current value for writing become less than or equal to a beam current value to be set in units of said regions.

5. The apparatus according to claim 1, wherein when a plurality of patterns are written on the workpiece, said selector unit is configured to select the current density and the maximal shot size on a per-pattern basis.

6. The apparatus according to claim 5, wherein said selector unit is configured to select the current density and the maximal shot size so that a beam current value for writing is less than or equal to a beam current value to be set per pattern.

7. A writing method comprising:
   analyzing a value of a writing time pursuant to a pattern data while using as variables a current density and a maximal shot size being in a relationship that a beam current value is less than or equal to a preset value;
   selecting, based on a result of said analyzing, a current density and a maximal shot size so as to be in a vicinity of a point of inflexion at which the writing time value changes in concavity; and
   shooting an electron beam onto a workpiece with the selected current density and a shot size less than or equal to said maximal shot size to thereby write thereon a pattern pursuant to said pattern data.

8. The method according to claim 7, wherein said beam current value is set based on the pattern data.

9. The method according to claim 7, wherein said beam current value is set based on an accuracy level as required for a pattern to be written.

10. The method according to claim 7, wherein said workpiece has a surface virtually divided into a plurality of pattern-writing regions and wherein said beam current value is determined in units of the regions.

11. The method according to claim 7, wherein when a plurality of patterns are written, said beam current value is set in units of the patterns.

12. A writing apparatus comprising:
a selector unit responsive to receipt of input data of a pattern to be written through more than two electron beam shots, configured to select a current density of an electron beam being shot and a maximal shot area thereof based on the inputted data of the pattern to be written; and a writing unit configured to form the electron beam with the current density as selected by said selector unit, shape the formed electron beam to have a shot area less than or equal to said maximal shot area, and shoot the shaped electron beam onto a workpiece to thereby write said pattern,
wherein said selector unit is configured to select the current density and the maximal shot area in a way such that, even when inputting different pattern data, a beam current value for shooting onto a workpiece the electron beam as shaped to have its area less than or equal to the maximal shot area is less than or equal to a preset value.

13. A writing apparatus, comprising:
a selector unit responsive to receipt of input data of a pattern to be written through more than two electron beam shots, configured to select a current density of an electron beam being shot and a maximal shot area thereof based on the inputted data of the pattern to be written; and a writing unit configured to form the electron beam with the current density as selected by said selector unit, shape the formed electron beam to have a shot area less than or equal to said maximal shot area, and shoot the shared electron beam onto a workpiece to thereby write said pattern,
wherein said selector unit is configured to select the current density and the maximal shot area so that a beam current value for writing is not greater than a beam current value to be set pursuant to the inputted data of the pattern to be written.

14. The apparatus according to claim 12, wherein said workpiece has a surface as virtually divided into a plurality of regions and wherein said selector unit is configured to select the current density and the maximal shot area in units of said regions.

15. The apparatus according to claim 14, wherein said selector unit is configured to select the current density and the maximal shot area so that a beam current value for writing is not greater than a beam current value as set in units of said regions.

16. The apparatus according to claim 12, wherein when more than two patterns are written onto said workpiece, said selector unit is configured to select the current density and the maximal shot area on a per-pattern basis.

17. The apparatus according to claim 16, wherein said selector unit is configured to select the current density and the maximal shot area so that a beam current value for writing is less than or equal to a beam current value to be set per pattern.

18. An apparatus for writing a prespecified pattern on a workpiece through more than two shots of an electron beam, comprising:
means for variably shaping shot size of a shot; and
means for varying a current density in accordance with each shot size so that a current value of a beam being shot onto the workpiece is less than or equal to a value as preset in each shot.

19. The apparatus according to claim 2, wherein said workpiece has a surface as virtually divided into a plurality of pattern-writing regions and wherein said selector unit is configured to select the current density and the maximal shot size in units of the regions.

20. The apparatus according to claim 19, wherein said selector units is configured to select the current density and the maximal shot size so that a beam current value for writing become less than or equal to a beam current value to be set in units of said regions.

21. The apparatus according to claim 2, wherein when a plurality of patterns are written on the workpiece, said selector unit is configured to select the current density and the maximal shot size on a per-pattern basis.

22. The apparatus according to claim 21, wherein said selector unit is configured to select the current density and the maximal shot size so that a beam current value for writing is less than or equal to a beam current value to be set per pattern.

23. The apparatus according to claim 13, wherein said workpiece has a surface as virtually divided into a plurality of regions and wherein said selector unit is configured to select the current density and the maximal shot area in units of said regions.

24. The apparatus according to claim 23, wherein said selector unit is configured to select the current density and the maximal shot area so that a beam current value for writing is not greater than a beam current value as set in units of said regions.

25. The apparatus according to claim 13, wherein when more than two patterns are written onto said workpiece, said selector unit is configured to select the current density and the maximal shot area on a per-pattern basis.

26. The apparatus according to claim 25, wherein said selector unit is configured to select the current density and the maximal shot area so that a beam current value for writing is less than or equal to a beam current value to be set per pattern.

* * * * *